United States Patent

Riess

[15] 3,697,843

[45] Oct. 10, 1972

[54] THREE-PHASE INVERTER CONTROL CIRCUIT

[72] Inventor: Joseph A. Riess, Kettering, Ohio

[73] Assignee: General Motors Corporation, Detroit, Mich.

[22] Filed: Nov. 30, 1971

[21] Appl. No.: 203,225

[52] U.S. Cl. ..................318/227, 318/230, 318/231, 321/5

[51] Int. Cl. ..............................................H02p 5/40

[58] Field of Search ...........318/227, 230, 231; 321/5

[56] References Cited

UNITED STATES PATENTS

| | | | |
|---|---|---|---|
| 3,423,662 | 1/1969 | Schlabach et al. | 318/227 X |
| 3,509,440 | 4/1970 | Johnston | 318/227 |
| 3,546,661 | 12/1970 | Risberg et al. | 318/227 |

*Primary Examiner*—Gene Z. Rubinson
*Attorney*—Eugene W. Christen et al.

[57] ABSTRACT

A three-stage counter circuit, responsive to the output signals of a variable frequency oscillator, produces three series of logic level signals and three series of complementary logic level signals, the repetition rate of each signal series being one-half the repetition rate of the series of the next highest repetition rate. A three-stage shift register circuit, responsive to the series of logic level signals of the lowest repetition rate, produces a repeating series of six electrical timing signals. An inverter silicon controlled rectifier NAND gate corresponding to each inverter silicon controlled rectifier produces a series of inverter silicon controlled rectifier trigger signals in response to the output signals of the variable frequency oscillator and the electrical timing signal during which the corresponding silicon controlled rectifier to be conductive and an extinguishing silicon controlled rectifier NAND gate corresponding to each extinguishing silicon controlled rectifier produces an extinguishing silicon controlled rectifier trigger signal in response to the series of complementary logic level signals of the lowest repetition rate and two of the electrical timing signals. The inverter silicon controlled rectifier trigger signals and the extinguishing silicon controlled rectifier trigger signal produced by each NAND gate are amplified by a respective silicon controlled rectifier trigger signal amplifier circuit and are applied across the inverter silicon controlled rectifiers and the extinguishing silicon controlled rectifiers of a three-phase inverter circuit in the proper sequence to provide for the cyclical energization of the phase windings of a three-phase alternating current motor from a direct current supply potential source.

10 Claims, 9 Drawing Figures

| A | B | $\overline{AB}$ |
|---|---|---|
| 0 | 0 | 1 |
| 0 | 1 | 1 |
| 1 | 0 | 1 |
| 1 | 1 | 0 |

| A | B | C | $\overline{ABC}$ |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

PATENTED OCT 10 1972

3,697,843

THREE-PHASE INVERTER CONTROL CIRCUIT

This invention is directed to a three-phase inverter control circuit and, more specifically, to a three-phase inverter control circuit which produces the signals which provide for the cyclical energization of the phase windings of a three-phase alternating current motor from a direct current supply potential source in a forward or a reverse direction, as selected, and includes an electrodynamic braking feature.

Alternating current motors have discrete phase windings corresponding to each phase of a compatible alternating current supply potential which are energized by the phase of the alternating current supply potential to which they correspond. Motors of this type normally operate at a constant, fixed speed which is determined by the frequency 'f the alternating current supply potential and the number of magnetic poles produced by the phase windings. In certain applications where motors of this type may be advantageously used, it may be desirable to operate the motor at variable speeds. To change the speed of alternating current motors, it has heretofore been necessary to change the frequency of the alternating current supply potential or the number of magnetic poles produced by the motor phase windings. Both of these alternatives have been unsatisfactory in that the former requires expensive frequency converting equipment and the latter provides, at best, step-by-step control through complex switching arrangements. As the use of alternating current motors is becoming increasingly popular, the requirement of a reliable and economical variable speed control system for motors of this type if apparent.

With the development of power silicon controlled rectifier devices, direct current to alternating current inverter circuits have been developed through which the phase windings of alternating current motors may be cyclically energized in an alternating current mode from a direct current potential source. The speed of alternating current motors operated from a direct current potential source through an inverter circuit may be varied over a wide range by varying the frequency at which trigger signals are supplied to the silicon controlled rectifiers of the inverter circuit. As the inverter circuit silicon controlled rectifiers must be energized in a predetermined sequence to produce rotation of the rotor of an alternating current motor and, since the inverter circuit is energized from a direct current potential source, extinguishing silicon controlled rectifiers must be provided to extinguish the inverter silicon controlled rectifiers in the proper sequence. To produce and supply the trigger signals to the inverter and extinguishing silicon controlled rectifiers of the inverter circuit to produce cyclical energization of the phase windings of an alternating current motor, an inverter control circuit is required.

It is, therefore, an object of this invention to provide an improved three-phase inverter control circuit.

It is another object of this invention to provide an improved three-phase inverter control circuit wherein a series of inverter silicon controlled rectifier gate power pulses are applied across the gate-cathode electrodes of each inverter silicon controlled rectifier of a three-phase inverter circuit during each conduction period.

It is another object of this invention to provide an improved three-phase inverter control circuit wherein a three-phase alternating current motor cyclically operated through the inverter circuit may be selectively operated in a forward and a reverse direction.

It is another object of this invention to provide an improved three-phase inverter control circuit wherein a three-phase alternating current motor cyclically operated through the inverter circuit may be electrodynamically braked by applying the direct current supply potential source across the three-phase windings of the motor upon the initiation of a brake signal.

In accordance with this invention, a three-phase inverter control circuit is provided wherein a repeating series of electrical timing signals is produced in response to a variable frequency oscillator, the leading and trailing edges of each of which mark the beginning and end, respectively, of an inverter silicon controlled rectifier conduction period, and circuitry responsive to the variable frequency oscillator and one of the timing signals produces a series of inverter silicon controlled rectifier trigger signals for and applies these trigger signals across the gate-cathode electrodes of the inverter silicon controlled rectifiers in the proper sequence to provide for the cyclical energization of a three-phase alternating current motor from a direct current supply potential source and other circuitry responsive to two of the electrical timing signals and a series of logic level signals produces extinguishing silicon controlled rectifier trigger signals for and applies these trigger signals across the gate-cathode electrodes of the proper extinguishing silicon controlled rectifiers of the inverter circuit to provide for the extinguishing of the inverter silicon controlled rectifiers in the proper sequence.

For a better understanding of the present invention, together with additional objects, advantages and features thereof, reference is made to the following description and accompanying drawings in which:

FIG. 1 sets forth the three-phase inverter control circuit of this invention in schematic form;

FIG. 2 is a schematic diagram of optional reversing logic;

FIG. 3 sets forth truth tables for two and three input logic NAND gates;

Figure 7:
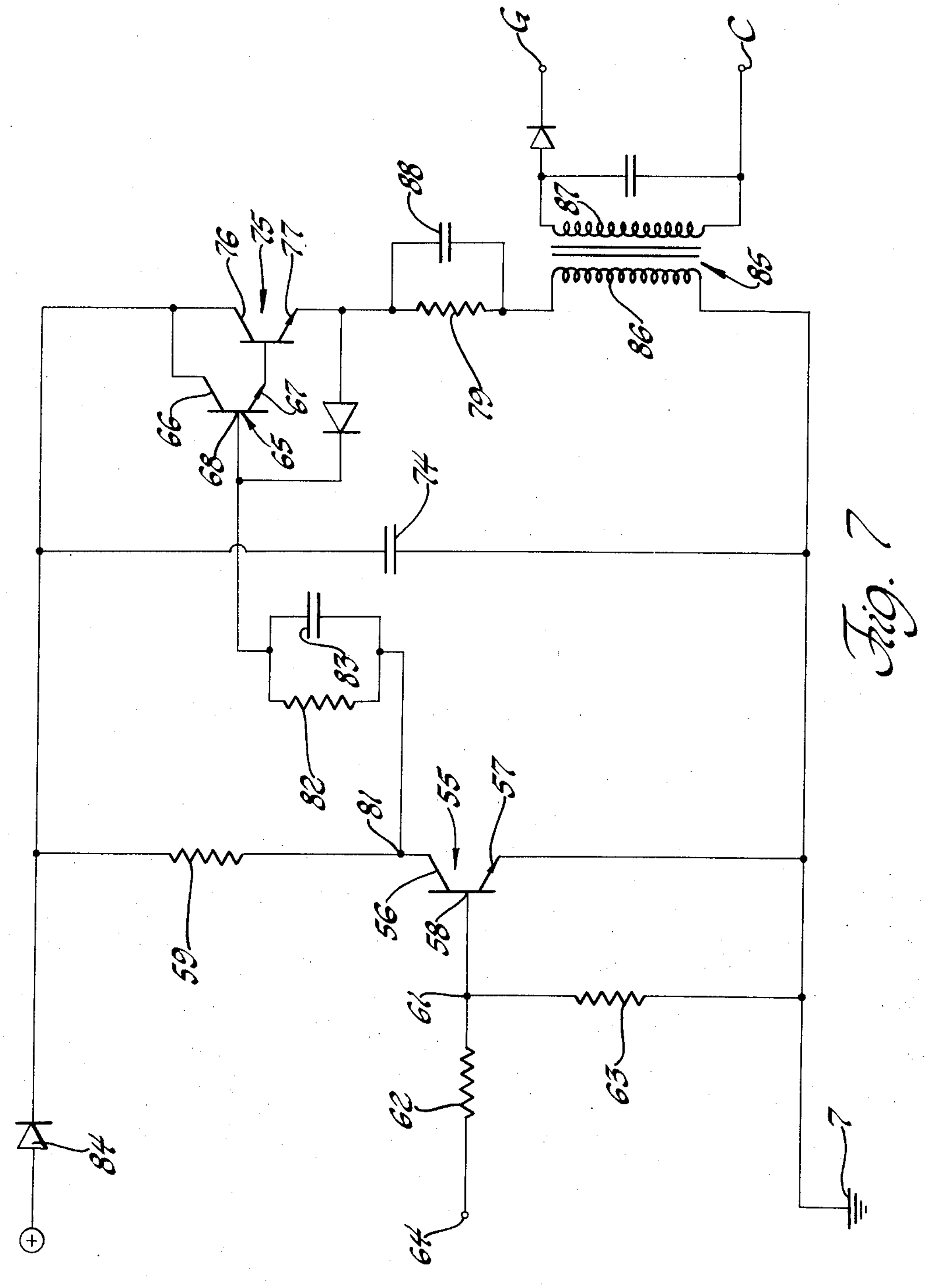
Figure 8:
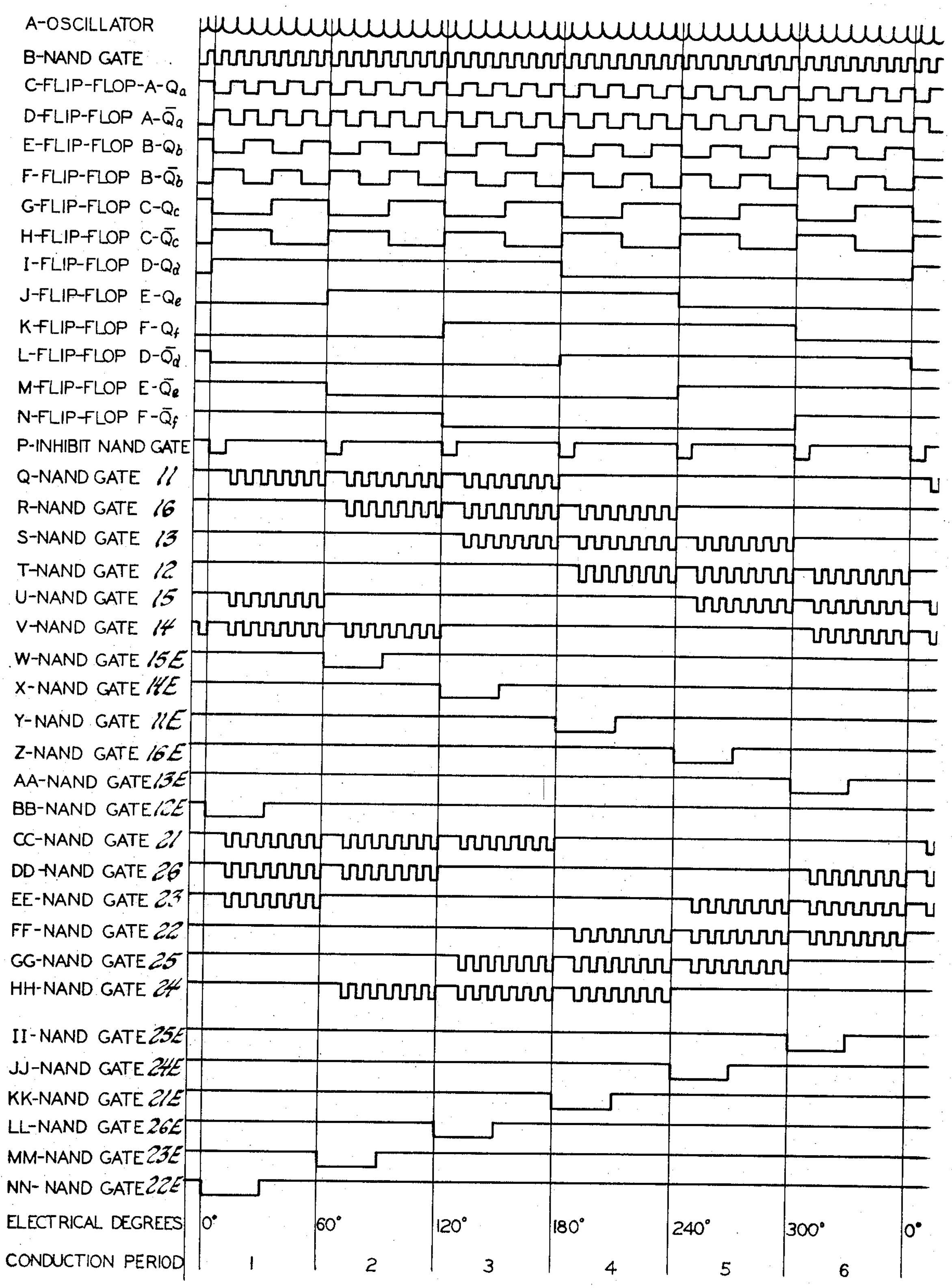

FIG. 7 sets forth, in schematic form, a silicon controlled rectifier trigger signal amplifier suitable for use with the inverter control circuit in this invention, and FIG. 8 is a set of curves useful in understanding the three-phase inverter control circuit of this invention.

As the point of reference or ground potential is the same point electrically throughout the system, it has been represented in the figures by the accepted schematic symbol and referenced by the numeral 7.

The three-phase inverter control circuit of this invention produces silicon controlled rectifier trigger signals and corresponding gate power signals for the inverter and corresponding extinguishing silicon controlled rectifiers, each having gate, anode and cathode electrodes, of a three-phase inverter circuit and applies the gate power signals to the inverter and extinguishing silicon controlled rectifiers of the inverter circuit in the proper sequence to provide for the cyclical energization of the phase windings of a three-phase alternating current motor from a direct current supply potential source.

Figure 6:
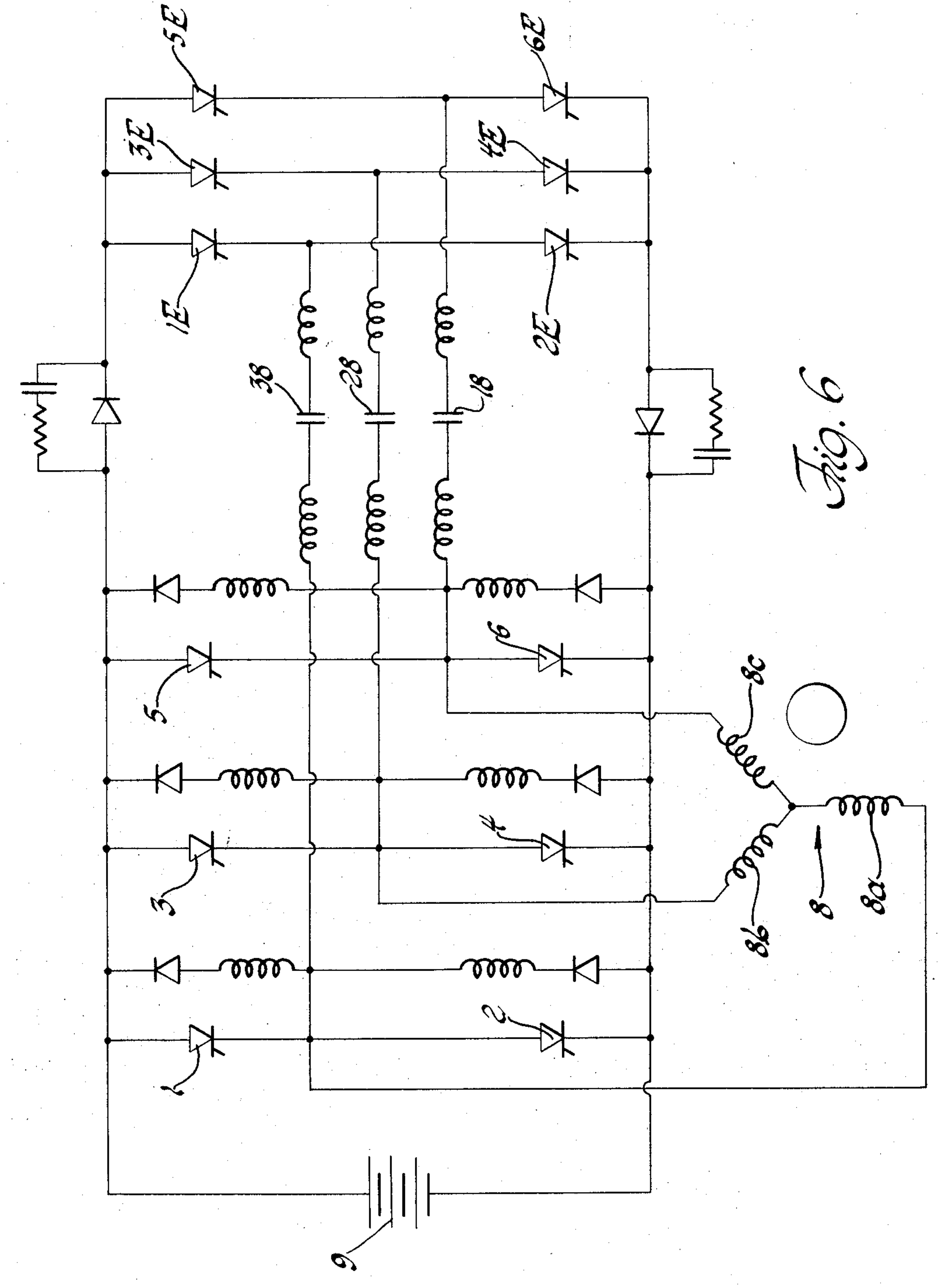
FIG. 6 is a schematic diagram of a three-phase inverter circuit suitable for use with the control circuit of this invention.

In FIG. 6 of the drawings, a three-phase inverter circuit through which a three-phase alternating current motor 8, having three wye connected phase windings 8*a*, 8*b* and 8*c*, may be energized from a direct current supply potential source, which may be a battery 9, is set forth in schematic form. The inverter circuit includes three positive inverter silicon controlled rectifiers 1, 3 and 5, three negative inverter silicon controlled rectifiers 2, 4 and 6 and an extinguishing silicon controlled rectifier corresponding to each inverter silicon controlled rectifier, referenced by the numerals 1E, 2E, 3E, 4E, 5E and 6E, respectively. This three-phase inverter circuit is described in detail in U.S. Pat. No. 3,354,370 Corry et al., Nov. 21, 1967, which is assigned to the same assignee as is the present application. Consequently, the operation of this three-phase inverter circuit will be described only briefly in this specification. To operate motor 8 from battery 9 through the three-phase inverter circuit of FIG. 6, the phase windings thereof may be cyclically energized during six sequential inverter silicon controlled rectifier conduction periods which complete 360 electrical degrees of motor energization. That is, for producing motor 8 rotation in one direction, during the first conduction period, the motor phase windings are energized by a motor phase winding energizing current flowing into phase windings 8*a* and 8*c* through inverter silicon controlled rectifiers 1 and 5 and out of phase winding 8b through inverter silicon controlled rectifier 4; during the second conduction period, inverter silicon controlled rectifier 5 is extinguished by the charge upon capacitor 18 applied in an inverse polarity relationship across the anode-cathode electrodes thereof through extinguishing silicon controlled rectifier 5E and the motor phase windings are energized by a motor phase winding energizing current flowing into phase winding 8*a* through inverter silicon controlled rectifier 1 and out of phase windings 8*b* and 8*c* through inverter silicon controlled rectifiers 4 and 6; during the third conduction period, inverter silicon controlled rectifier 4 is extinguished by the charge upon capacitor 28 applied in an inverse polarity relationship across the anode-cathode electrodes thereof through extinguishing silicon controlled rectifier 4E and the motor phase windings are energized by a motor phase winding energizing current flowing into phase windings 8*a* and 8*b* through inverter silicon controlled rectifiers 1 and 3 and out of phase winding 8*c* through inverter silicon controlled rectifier 6; during the fourth conduction period, inverter silicon controlled rectifier 1 is extinguished by the charge upon capacitor 38 applied in an inverse polarity relationship across the anode-cathode electrodes thereof through extinguishing silicon controlled rectifier 1E and the motor phase windings are energized by a motor phase winding energizing current flowing into phase windings 8*b* through inverter silicon controlled rectifier 3 and out of phase windings 8*a* and 8*c* through inverter silicon controlled rectifiers 2 and 6; during the fifth conduction period, inverter silicon controlled rectifier 6 is extinguished by the charge upon capacitor 18 applied in an inverse polarity relationship across the anode-cathode electrodes thereof through extinguishing silicon controlled rectifier 6E and the motor phase windings are energized by a motor phase winding energizing current flowing into phase windings 8*b* and 8*c* through inverter silicon controlled rectifiers 3 and 5 and out of phase winding 8*a* through inverter silicon controlled rectifier 2 and during the sixth conduction period, inverter silicon controlled rectifier 3 is extinguished by the charge upon capacitor 28 applied in an inverse polarity relationship across the anode-cathode electrodes thereof through extinguishing silicon controlled rectifier 3E and the motor phase windings are energized by a motor phase winding energizing current flowing into phase winding 8*c* through inverter silicon controlled rectifier 5 and out of phase windings 8*a* and 8*b* through inverter silicon controlled rectifiers 2 and 4. This completes 360 electrical degrees of motor energization, as during the next conduction period, inverter silicon controlled rectifier 2 is extinguished by the charge upon capacitor 38 applied in an inverse polarity relationship across the anode-cathode electrodes thereof through extinguishing silicon controlled rectifier 2E and the motor phase windings are again energized by a motor phase winding energizing current flowing into phase windings 8a and 8c through inverter silicon controlled rectifiers 1 and 5 and out of phase winding 8b through inverter silicon controlled rectifier 4.

The three-phase inverter control circuit of this invention, schematically set forth in FIGS. 1 and 4 for producing motor rotation in a forward direction and in FIGS. 1 and 5 for producing motor rotation in a reverse direction in a manner to be later explained, produces the proper inverter and extinguishing silicon controlled rectifier trigger signals and corresponding gate power signals and applies the gate power signals across the gate-cathode electrodes of the inverter and extinguishing silicon controlled rectifiers of the three-phase inverter circuit of FIG. 6 in the proper sequence to provide for the energization of the phase windings of motor 8 from battery 9.

Figure 1:
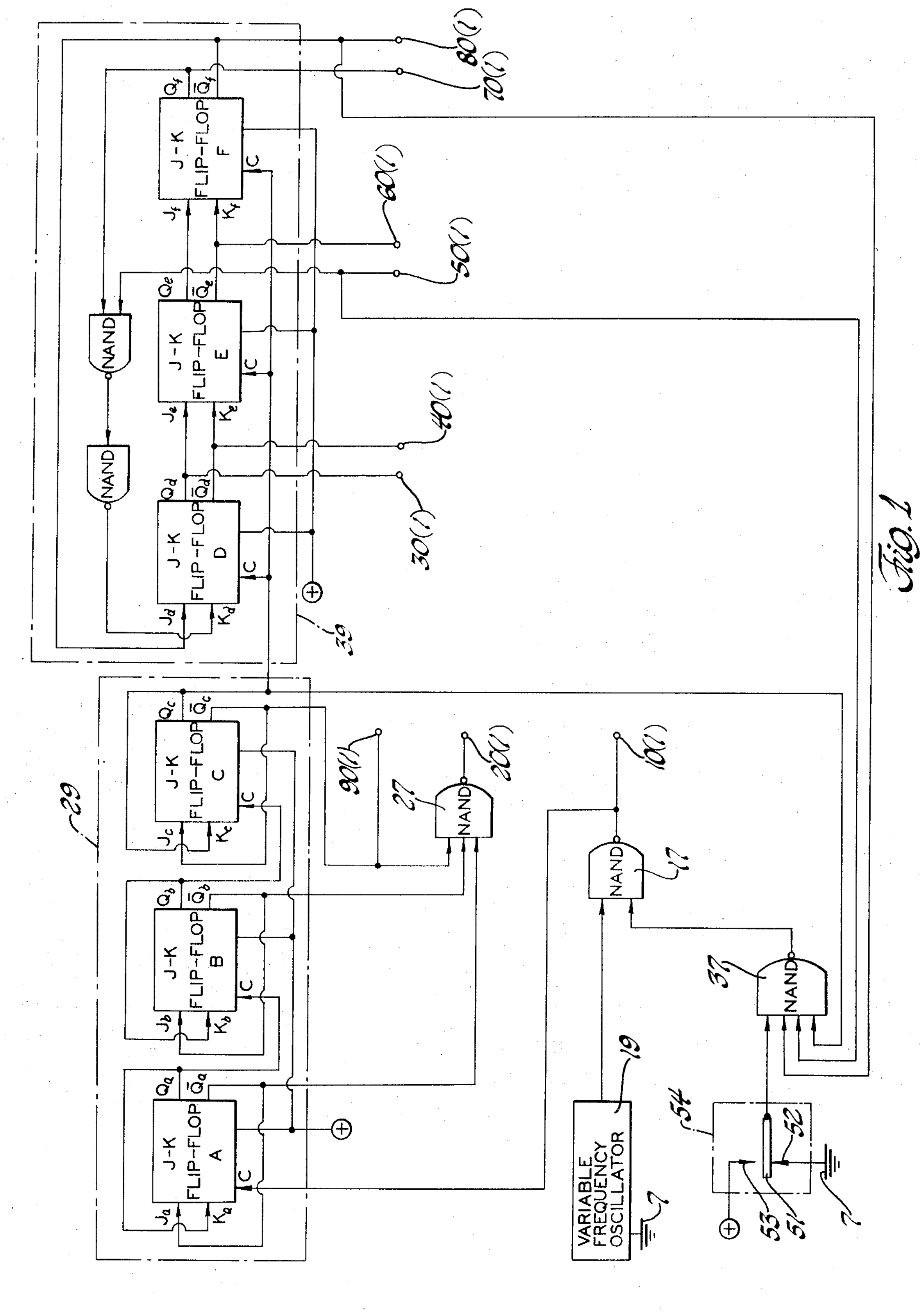

A variable frequency oscillator 19, FIG. 1, produces a series of output signals of a selectable variable frequency, as shown in FIG. 8A, which may be shaped by a conventional two-input NAND gate 17 to provide a series of square wave form electrical pulses, as shown in FIG. 8B. As variable frequency oscillator 19 may be any one of the many conventional variable frequency oscillators well known in the art and, per se, forms no part of this invention, it has been indicated in FIG. 1 in block form. One example of a variable frequency oscillator suitable for use with three-phase inverter control circuit of this invention is disclosed and described in detail in U.S. Pat. application, Ser. No. 68,068, Staker, filed Aug. 31, 1970 which is assigned to the same assignee as is this application.

Figure 3A:
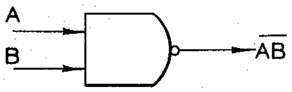
Figure 3B:
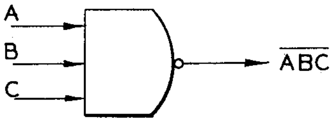

The NAND gate is a commercially available logic circuit element well known in the art which requires a "high" or logic 1 signal on each of the input terminals to produce a "low" or logic 0 signal upon the output terminal thereof. The truth table for a two-input NAND gate and a three-input NAND gate are set forth in respective FIGS. 3A and 3B. As NAND gates are commercially available and well known in the art and, per se, form no part of this invention, all of the NAND gates have been illustrated in the several figures in block form.

Circuitry responsive to the output signals of variable frequency oscillator 19 for producing a plurality of series of logic level signals and a plurality of series of complementary logic level signals, the repetition rate of each series of logic level signals and each series of complementary logic level signals being one-half the repetition of the series of logic level signals and the series of complementary logic level signals of the next highest repetition rate, is provided. One example, and without intention or inference of a limitation thereto, of this circuitry is a three-stage counter circuit 29 comprised of three J-K flip-flop circuit A, B and C, each having a J, a K and a C, or clock, input terminal and Q and $\overline{Q}$ output terminals, interconnected as shown in FIG. 1 with the output signals produced by variable frequency oscillator 19 applied to the C input terminal of J-K flip-flop A through NAND gate 17. Each of J-K flip-flops A, B and C produces a series of complementary logic level signals, as shown in respective curves 8C, 8E and 8G, and a series of complementary logic level signals, as shown in respective curves 8D, 8F and 8H. As is apparent from these curves, the repetition rate of each series of logic level signals and complementary logic level signals is one-half the repetition rate of the series of logic level signals and complementary logic level signals of the next highest repetition rate. In the embodiment of the three-phase inverter control circuit of this invention described in this specification, a three-stage counter circuit is set forth. It is to be specifically understood that counter circuits of more or less stages may be employed without departing from the spirit of the invention.

Circuitry responsive to the series of logic level signals of the lowest repetition rate for producing a repeating series of six electrical timing signals is provided. One example of this circuitry, and without intention or inference of a limitation thereto, is a three-stage shift register circuit 39 comprised of three J-K flip-flop circuits D, E and F, each having a J, a K and a C, or clock, input terminal and Q and $\overline{Q}$ output terminals, interconnected as shown in FIG. 1 with the series of logic level signals of the lowest repetition rate, which appear upon the $Q_c$ output terminal of J-K flip-flop C of counter circuit 29, applied to the C input terminal of all of the J-K flip-flop circuits of shift register circuit 39 in parallel. The repeating series of six electrical timing signals produced by the three-stage shift register circuit 39 are set forth in FIGS. 8I, 8J, 8K, 8L, 8M and 8N. The leading and trailing edges of each of these six electrical timing signals mark the beginning and end, respectively, of a conduction period during which a corresponding inverter silicon controlled rectifier is to be conductive.

As J-K flip-flop circuits are commercially available and well known in the art, each has been illustrated in block form in FIG. 1. One example of a J-K flip-flop circuit suitable for use in the counter and shift register circuits of the three-phase inverter control circuit of this invention is a type MC-663 marketed by Motorola Semiconductor Products, Inc.

Circuitry responsive to each of the electrical timing signals and the output signals of variable frequency oscillator 19 for producing a series of inverter silicon controlled rectifier trigger signals for and applying the inverter silicon controlled rectifier trigger signals across the gate-cathode electrodes of the inverter silicon controlled rectifiers in the proper sequence to provide for the cyclical energization of the three-phase alternating current motor 8 from the direct current supply potential source 9 is provided. An inverter silicon controlled rectifier NAND gate having three input terminals and one output terminal corresponding to each inverter silicon controlled rectifier for producing a series of inverter silicon controlled rectifier trigger signals is provided. The trigger signals produced by these inverter silicon controlled rectifier NAND gates are applied across the gate-cathode electrodes of the inverter silicon controlled rectifier next to be triggered conductive to provide for the cyclical energization of three-phase alternating current motor 8 from direct current supply potential source 9 in a manner to be explained later in this specification.

Circuitry responsive to two of the electrical timing signals and the complementary logic level signals of the series of complementary logic level signals of the lowest repetition rate for producing extinguishing silicon controlled rectifier trigger signals for and applying the extinguishing silicon controlled rectifier trigger signals across the gate-cathode electrodes of the extinguishing silicon controlled rectifiers in the proper sequence to extinguish the inverter silicon controlled rectifiers in the proper sequence is also provided. An extinguishing silicon controlled rectifier NAND gate having three input terminals and one output terminal corresponding to each extinguishing silicon controlled rectifier for producing an extinguishing silicon controlled rectifier trigger signal is provided. The trigger signals produced by these extinguishing silicon controlled rectifier NAND gates are applied across the gate-cathode electrodes of the extinguishing silicon controlled rectifiers corresponding to the inverter silicon controlled rectifier next to be extinguished in a manner to be explained in detail later in this specification.

With some applications, it may be necessary to produce inverter and extinguishing silicon controlled rectifier gate power signals in response to the trigger signals produced by the inverter and extinguishing silicon controlled rectifier NAND gates through which the inverter and extinguishing silicon controlled rectifier trigger signals are applied across the gate-cathode electrodes of the proper inverter and extinguishing silicon controlled rectifiers. One example of a trigger signal amplifying circuit suitable for use with the three-phase inverter control circuit of this invention is set forth in schematic form in FIG. 7 and will be described in detail later in this specification.

Figure 4:
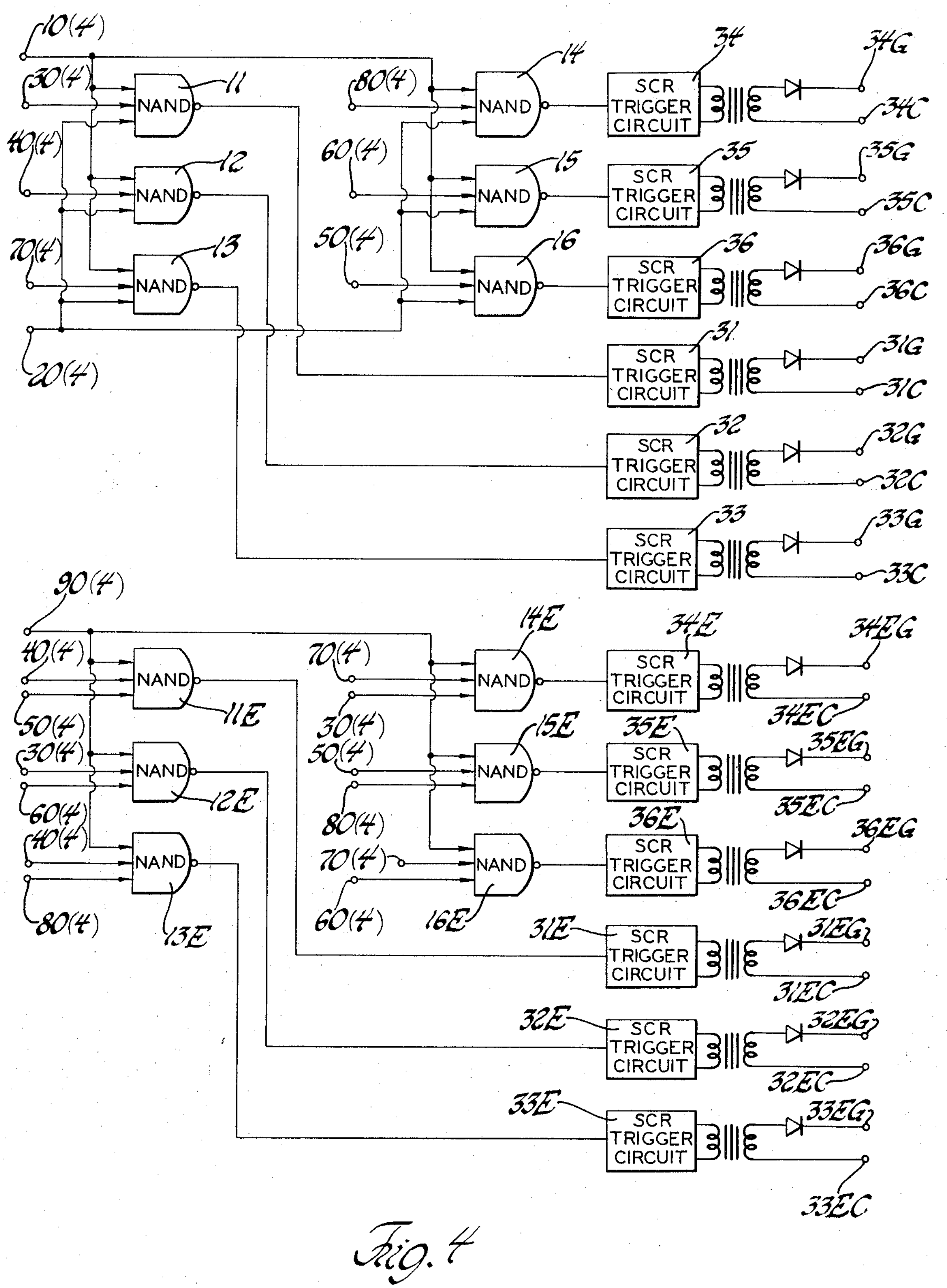
FIG. 4 is a schematic diagram of the inverter and extinguishing silicon controlled rectifier trigger signal logic and gate power amplifiers for motor rotation in a forward direction.

The inverter silicon controlled rectifier NAND gates which produce the inverter silicon controlled rectifier trigger signals for the operation of motor 8 in a direction which will be referred to as "forward" for purposes of this specification and the associated trigger signal amplifier circuits through which the inverter silicon controlled rectifier trigger signals produced by these NAND gates are applied across the gate-cathode electrodes of the inverter silicon controlled rectifiers in the proper sequence to provide for the cyclical energization, in a forward direction, of the three-phase alternating current motor 8 from direct current supply potential source 9 and the extinguishing silicon controlled rectifier NAND gates which produce the extinguishing silicon controlled rectifier trigger signals and the associated trigger signal amplifier circuits through which the extinguishing silicon controlled rectifier trigger signals produced by these NAND gates are applied across the gate-cathode electrodes of the extinguishing silicon controlled rectifiers in the proper sequence to extinguish the inverter silicon controlled rectifiers in the proper sequence are set forth in schematic form in FIG. 4. These NAND gates will hereinafter be referred to as forward inverter silicon controlled rectifier NAND gates and forward extinguishing silicon controlled rectifier NAND gates. The forward inverter silicon controlled rectifier NAND gates are referenced by the numerals 11, 12, 13, 14, 15 and 16 which correspond to respective inverter silicon controlled rectifiers 1, 2, 3, 4, 5 and 6. The associated trigger signal amplifier circuits, if required, through which the inverter silicon controlled rectifier trigger signals produced by these forward inverter silicon controlled rectifier NAND gates are applied across the gate-cathode electrodes of the inverter silicon controlled rectifiers are set forth in block form in FIG. 4 and referenced by the numerals 31, 32, 33, 34, 35 and 36. The forward extinguishing silicon controlled rectifier NAND gates are reference by the numerals 11E, 12E, 13E, 14E, 15E and 16E which correspond to respective extinguishing silicon controlled rectifiers 1E, 2E, 3E, 4E, 5E and 6E. The associated trigger signal amplifier circuits, if required, through which the extinguishing silicon controlled rectifier trigger signals produced by these forward extinguishing silicon controlled rectifier NAND gates are applied across the gate-cathode electrodes of the extinguishing silicon controlled rectifiers are referenced by the numerals 31E, 32E, 33E, 34E, 35E and 36E.

Circuitry responsive to the complementary logic level signals for producing a blanking signal for inhibiting the production of the inverter silicon controlled rectifier trigger signals for the duration of one of the complementary logic level signals of the series of complementary logic level signals having the highest repetition rate is provided. This is an extremely desirable feature in that it insures that the next inverter silicon controlled rectifier to be triggered conductive will be delayed until the adjacent inverter silicon controlled rectifier has been extinguished, thereby preventing the possibility of a direct short-circuit across the source of direct current operating potential 9 should two adjacent, that is series connected, inverter silicon controlled rectifiers be simultaneously triggered conductive. To produce the blanking signal, an inverter silicon controlled rectifier trigger signal inhibit NAND gate 27, FIG. 1, having an input terminal corresponding to each series of complementary logic level signals is provided. Each series of complementary logic level signals is applied to a respective input terminal of inhibit NAND gate 27. In FIG. 1, the complementary logic level signals appearing upon the $\overline{Q}$ output terminal of each of J-K flip-flop circuits A, B and C of counter circuit 29 are shown to be connected to a respective input terminal of inhibit NAND gate 27.

To operate motor 8 only in a forward direction, the circuitry of FIG. 1 is interconnected with the circuitry of FIG. 4 by electrical connections between point 10(1) of FIG. 1 and point 10(4) of FIG. 4; between point 20(1) of FIG. 1 and point 20(4) of FIG. 4; between point 30(1) of FIG. 1 and all points 30(4) of FIG. 4; between point 40(1) of FIG. 1 and all points 40(4) of FIG. 4; between point 50(1) of FIG. 1 and all points 50(4) of FIG. 4; between point 60(1) of FIG. 1 and all points 60(4) of FIG. 4; between point 70(1) of FIG. 1 and all points 70(4) of FIG. 4; between point 80(1) of FIG. 1 and all points 80(4) of FIG. 4 and point 90(1) of FIG. 1 and point 90(4) of FIG. 4. These points of FIGS. 1 and 4, although indicated in each as small circles, are not necessarily to be interpreted as terminals but are merely convenient points at which the interconnections between the circuitry of FIG. 1 and the circuitry of FIG. 4 may be illustrated for purposes of this specification.

The output signals of variable frequency oscillator 19 are applied to one of the input terminals of all of the forward inverter silicon controlled rectifier NAND gates through point 10(1) of FIG. 1 and point 10(4) of FIG. 4.

Each electrical timing signal is applied to another input terminal of the forward inverter silicon controlled rectifier NAND gate which corresponds to the inverter silicon controlled rectifier which is to be conductive during the conduction period marked by the leading and trailing edges of that electrical timing signal. That is, the electrical timing signal appearing upon the $Q_d$ output terminal of J-K flip-flop D is applied to another input terminal of forward inverter silicon controlled rectifier NAND gate 11, corresponding to inverter silicon controlled rectifier 1 which is to be conductive during the conduction period marked by the leading and trailing edges of that electrical timing signal, through point 30(1) of FIG. 1 and point 30(4) of the upper part of FIG. 4; the electrical timing signal appearing upon the $\overline{Q}_d$ output terminal of J-K flip-flop D is applied to another input terminal of forward inverter silicon controlled rectifier NAND gate 12, corresponding to inverter silicon controlled rectifier 2 which is to be conductive during the conduction period marked by the leading and trailing edges of that electrical timing signal, through point 40(1) of FIG. 1 and point 40(4) of the upper part of FIG. 4; the electrical timing signal appearing upon the $Q_e$ output terminal of J-K flip-flop E is applied to another input terminal of forward inverter silicon controlled rectifier NAND gate 16, corresponding to inverter silicon controlled rectifier 6 which is to be conductive during the conduction period marked by the leading and trailing edges of that electrical timing signal, through point 50(1) of FIG. 1 and point 50(4) of the upper part of FIG. 4; the electrical timing signal appearing upon the $\overline{Q}_e$ output terminal of J-K flip-flop E is applied to another input terminal of forward inverter silicon controlled rectifier NAND gate 15, corresponding to inverter silicon controlled rectifier 5 which is to be conductive during the conduction period marked by the leading and trailing edges of that electrical timing signal, through point 60(1) of FIG. 1 and point 60(4) of the upper part of FIG. 4; the electrical timing signal appearing upon the $Q_f$ output terminal of J-k flip-flop F is applied to another input terminal of forward inverter silicon controlled rectifier NAND gate 13, corresponding to inverter silicon controlled rectifier 3 which is to be conductive during the conduction period marked by the leading and trailing edges of that electrical timing signal, through point 70(1) of FIG. 1 and point 70(4) of the upper part of FIG. 4 and the electrical timing signal appearing upon the $\overline{Q}_f$ output terminal of J-K flip-flip F is applied to another input terminal of forward inverter silicon controlled rectifier NAND gate 14, corresponding to inverter silicon controlled rectifier 4 which is to be conductive during the conduction period marked by the leading and trailing edges of that electrical timing signal, through point 80(1) of FIG. 1 and point 80(4) of the upper part of FIG. 4. Consequently, each of forward inverter silicon controlled rectifier NAND gates 11 through 16, inclusive, produces a series of inverter silicon controlled rectifier trigger signals as shown in FIGS. 8Q, 8R, 8S, 8T, 8U and 8V in response to the output signals of variable frequency oscillator 19 and the electrical timing signal which marks the conduction period during which the corresponding inverter silicon controlled rectifier is to be conductive.

The series of inverter silicon controlled rectifier trigger signals produced by each forward inverter silicon controlled rectifier NAND gate are applied across the gate-cathode electrodes of the inverter silicon controlled rectifier to which it corresponds. In the embodiment of the three-phase inverter control circuit of this invention set forth in this specification, the series of inverter silicon controlled rectifier trigger signals produced by each forward inverter silicon controlled rectifier NAND gate is applied across the gate-cathode electrodes of the inverter silicon controlled rectifier to which it corresponds through a respective silicon controlled rectifier trigger signal amplifier circuit which, in response to the series of inverter silicon controlled rectifier trigger signals produced by each respective forward inverter silicon controlled rectifier NAND gate, produces a series of inverter silicon controlled rectifier gate power signals. That is, the series of inverter silicon controlled rectifier trigger signals produced by forward inverter silicon controlled rectifier NAND gate 11 are applied across the gate-cathode electrodes of inverter silicon controlled rectifier 1 through respective output terminals 31G and 31C of silicon controlled rectifier trigger signal amplifier circuit 31, the series of inverter silicon controlled rectifier trigger signals produced by forward inverter silicon controlled rectifier NAND gate 12 are applied across the gate-cathode electrodes of inverter silicon controlled rectifier 2 through respective output terminals 32G and 32C of silicon controlled rectifier trigger signal amplifier circuit 32, the series of inverter silicon controlled rectifier trigger signals produced by forward inverter silicon controlled rectifier NAND gate 13 are applied across the gate-cathode electrodes of inverter silicon controlled rectifier 3 through respective output terminals 33G and 33C of silicon controlled rectifier trigger signal amplifier circuit 33, the series of inverter silicon controlled rectifier trigger signals produced by forward inverter silicon controlled rectifier NAND gate 14 are applied across the gate-cathode electrodes of inverter silicon controlled rectifier 4 through respective output terminals 34G and 34C of silicon controlled rectifier trigger signal amplifier circuit 34, the series of inverter silicon controlled rectifier trigger signals produced by forward inverter silicon controlled rectifier NAND gate 15 are applied across the gate-cathode electrodes of inverter silicon controlled rectifier 5 through respective output terminals 35G and 35C of silicon controlled rectifier trigger signal amplifier circuit 35 and the series of inverter silicon controlled rectifier trigger signals produced by forward inverter silicon controlled rectifier NAND gate 16 are applied across the gate-cathode electrodes of inverter silicon controlled rectifier 6 through respective output terminals 36G and 36C of silicon controlled rectifier trigger signal amplifier circuit 36.

The series of complementary logic level signals of the lowest repetition rate, which appear upon the $\overline{Q}_c$ output terminal of J-K flip-flop C of counter circuit 29, are applied to one of the input terminals of all of the forward extinguishing silicon controlled rectifier NAND gates through point 90(1) of FIG. 1 and point 90(4) of FIG. 4.

The electrical timing signal having the leading edge which marks the beginning of the next conduction period and the electrical timing signal having the trailing edge which marks the next end of a conduction period are applied to respective input terminals of the one forward extinguishing silicon controlled rectifier NAND gate corresponding to the extinguishing silicon controlled rectifier which, when triggered conductive, will extinguish the inverter silicon controlled rectifier which was conductive during the conduction period last ended. That is, the electrical timing signal appearing upon the $Q_d$ output terminal of J-K flip-flop D, the leading edge of which marks the beginning of the first conduction period, and the electrical timing signal appearing upon the $\overline{Q}_e$ output terminal of J-k flip-flop E, the trailing edge of which marks the next end of a conduction period, are applied, through respective points 30(1) and 60(1) of FIG. 1 and points 30(4) and 60(4) of the lower part of FIG. 4, to respective input terminals of forward extinguishing silicon controlled rectifier NAND gate 12E, corresponding to extinguishing silicon controlled rectifier 2E which, when triggered conductive, will extinguish inverter silicon controlled rectifier 2 which was conductive during the conduction period last ended, marked by the leading and trailing edges of the electrical timing signal present upon the $\overline{Q}_d$ output terminal of J-K flip-flop D; the electrical timing signal appearing upon the $Q_e$ output terminal of J-K flip-flop E, the leading edge of which marks the beginning of the second conduction period, and the electrical timing signal appearing upon the $\overline{Q}_f$ output terminal of J-K flip-flop F, the trailing edge of which marks the next end of a conduction period, are applied, through respective points 50(1) and 80(1) of FIG. 1 and points 50(4) and 80(4) of the lower part of FIG. 4, to respective input terminals of forward extinguishing silicon controlled rectifier NAND gate 15E, corresponding to extinguishing silicon controlled rectifier 5E which, when triggered conductive, will extinguish inverter silicon controlled rectifier 5 which was conductive during the conduction period last ended, marked by the leading and trailing edges of the electrical timing signal present upon the $\overline{Q}_e$ output terminal of J-K flip-flop E; the electrical timing signal appearing upon the $Q_f$ output terminal of J-K flip-flop F, the leading edge of which marks the beginning of the third conduction period, and the electrical timing signal appearing upon the $Q_d$ output terminal of J-K flip-flop D, the trailing edge of which marks the next end of a conduction period, are applied, through respective points 70(1) and 30(1) of FIG. 1 and points 70(4) and 30(4) of the lower part of FIG. 4, to respective input terminals of forward extinguishing silicon controlled rectifier NAND gate 14E, corresponding to extinguishing silicon controlled rectifier 4E which, when triggered conductive, will extinguish inverter silicon controlled rectifier 4 which was conductive during the conduction period last ended, marked by the leading and trailing edges of the electrical timing signal present upon the $\overline{Q}_f$ output terminal of J-K flip-flop F; the electrical timing signal appearing upon the $\overline{Q}_d$ output terminal of J-K flip-flop D, the leading edge of which marks the beginning of the fourth conduction period, and the electrical timing signal appearing upon the $Q_e$ output terminal of J-K flip-flop E, the trailing edge of which marks the next end of a conduction period, are applied, through respective points 40(1) and 50(1) of FIG. 1 and points 40(4) and 50(4) of the lower part of FIG. 4, to respective input terminals of forward extinguishing silicon controlled rectifier NAND gate 11E, corresponding to extinguishing silicon controlled rectifier 1E which, when triggered conductive, will extinguish inverter silicon controlled rectifier 1 which was conductive during the conduction period last ended, marked by the leading and trailing edges of the electrical timing signal present upon the $Q_d$ output terminal of J-K flip-flop D; the electrical timing signal appearing upon the $\overline{Q}_e$ output terminal of J-K flip-flop E, the leading edge of which marks the beginning of the fifth conduction period, and the electrical timing signal appearing upon the $Q_f$ output terminal of J-K flip-flop F, the trailing edge of which marks the next end of a conduction period, are applied, through respective points 60(1) and 70(1) of FIG. 1 and points 60(4) and 70(4) of the lower part of FIG. 4, to respective input terminals of forward extinguishing silicon controlled rectifier NAND gate 16E, corresponding to extinguishing silicon controlled rectifier 6E which, when triggered conductive, will extinguish inverter silicon controlled rectifier 6 which was conductive during the conduction period last ended, marked by the leading and trailing edges of the electrical timing signal present upon the $Q_e$ output terminal of J-K flip-flop E and the electrical timing signal appearing upon the $\overline{Q}_f$ output terminal of J-K flip-flop F, the leading edge of which marks the beginning of the sixth conduction period, and the electrical timing signal appearing upon the $\overline{Q}_d$ output terminal of J-K flip-flop D, the trailing edge of which marks the next end of a conduction period, are applied, through respective points 80(1) and 40(1) of FIG. 1 and points 80(4) and 40(4) of the lower part of FIG. 4, to respective input terminals of forward extinguishing silicon controlled rectifier NAND gate 13E, corresponding to extinguishing silicon controlled rectifier 3E which, when triggered conductive, will extinguish the inverter silicon controlled rectifier which was conductive during the conduction period last ended, marked by the leading and trailing edges of the electrical timing signal present upon the $Q_f$ output terminal of J-K flip-flop F. Consequently, each of forward extinguishing silicon controlled rectifier NAND gates 11E through 16E, inclusive, produce an extinguishing silicon controlled rectifier trigger signal as shown in FIGS. 8W, 8X, 8Y, 8Z, 8AA and 8BB in response to the complementary logic level signal of the lowest repetition rate, the electrical timing signal having the leading edge which marks the beginning of the next conduction period and the electrical timing signal having the trailing edge which marks the end of a conduction period.

The extinguishing silicon controlled rectifier trigger signal produced by each forward extinguishing silicon controlled rectifier NAND gate is applied across the gate-cathode electrodes of the extinguishing silicon controlled rectifier to which it corresponds. In the embodiment of the three-phase inverter control circuit of this invention set forth in this specification, the extinguishing silicon controlled rectifier trigger signal produced by each forward extinguishing silicon controlled rectifier NAND gate is applied across the gate-cathode electrodes of the extinguishing silicon controlled rectifier to which it corresponds through a respective silicon controlled rectifier trigger signal amplifier circuit which, in response to the extinguishing silicon controlled rectifier trigger signal produced by each respective forward extinguishing silicon controlled rectifier NAND gate, produces an extinguishing silicon controlled rectifier gate power signal. That is, the extinguishing inverter silicon controlled rectifier trigger signal produced by forward extinguishing silicon controlled rectifier NAND gate 11E is applied across the gate-cathode electrodes of extinguishing silicon controlled rectifier 1E through respective output terminals 31EG and 31EC of silicon controlled rectifier trigger signal amplifier circuit 31E, the extinguishing silicon controlled rectifier trigger signal produced by forward extinguishing silicon controlled rectifier NAND gate 12E is applied across the gate-cathode electrodes of extinguishing silicon controlled rectifier 2E through respective output terminals 32EG and 32EC of silicon controlled rectifier trigger signal amplifier circuit 32E, the extinguishing silicon controlled rectifier trigger signal produced by forward extinguishing silicon controlled rectifier NAND gate 13E is applied across the gate-cathode electrodes of extinguishing silicon controlled rectifier 3E through respective output terminals 33EG and 33EC of silicon controlled rectifier trigger signal amplifier circuit 33E, the extinguishing silicon controlled rectifier trigger signal produced by forward extinguishing silicon controlled rectifier NAND gate 14E is applied across the gate-cathode electrodes of extinguishing silicon controlled rectifier 4E through respective output terminals 34EG and 34EC of silicon controlled rectifier trigger signal amplifier circuit 34E, the extinguishing inverter silicon controlled rectifier trigger signal produced by forward extinguishing silicon controlled rectifier NAND gate 15E is applied across the gate-cathode electrodes of extinguishing silicon controlled rectifier 5E through respective output terminals 35EG and 35EC of silicon controlled rectifier trigger signal amplifier circuit 35E and the extinguishing silicon controlled rectifier trigger signal produced by forward extinguishing silicon controlled rectifier NAND gate 16E is applied across the gate-cathode electrodes of extinguishing silicon controlled rectifier 6E through respective output terminals 36EG and 36EC of silicon controlled rectifier trigger signal amplifier circuit 36E.

The output signal produced by inhibit NAND gate 27 upon the simultaneous application of the three complementary logic level signal to respective input terminals thereof is applied to another input terminal of all of the forward inverter silicon controlled rectifier NAND gates through point 20(1) of FIG. 1 and point 20(4) of FIG. 4.

In accordance with logic terminology well known in the art, throughout the remainder of this specification, the logic signals appearing upon the Q and $\overline{Q}$ output terminals of all of the J-K flip-flop circuits and the logic signals appearing upon the output terminals of all of the NAND gates will be referred to as being in the "high" or logic 1 state or in the "low" or logic 0 state. For purposes of this specification, and without intention or inference of a limitation thereto, the "high" or logic 1 signals appearing upon these output terminals will be considered to be of a positive polarity potential and the "low" or logic 0 signals appearing upon these output terminals will be considered to be of zero or ground potential.

In FIG. 1 there is illustrated a NAND gate 37 which will hereinafter be referred to as the brake signal NAND gate and will be explained in detail later in this specification. However, as the movable contact 51 of brake switch 54 is closed to stationary contact 52 thereof, connected to point of reference or ground potential 7, a "low" or logic 0 signal is applied to one of the input terminals of brake NAND gate 37. Consequently, the logic output signal present upon the output terminal thereof is a "high" or logic 1 signal. In the following description of the operation of the three-phase inverter control circuit of this invention, it will be assumed that movable contact 51 of brake switch 54 is maintained in electrical contact with stationary contact 52 thereof and that, consequently, a logic 1 signal is maintained upon one of the input terminals of NAND gate 17.

With a logic 1 signal maintained upon one input terminal of NAND gate 17, upon each fall of the output signals of variable frequency oscillator 19, applied to the other input terminal of NAND gate 17, a logic 1 signal appears upon the output terminal of NAND gate 17, as is shown in FIG. 8B. The output signal appearing upon the output terminal of NAND gate 17 is applied to the C or clock input terminal of J-K flip-flop A of counter circuit 29 and is applied to one of the input terminals of all of the forward inverter silicon controlled rectifier NAND gates 11, 12, 13, 14, 15 and 16 of FIG. 4 through point 10(1) of FIG. 1 and point 10(4) of FIG. 4 through electrical connections therebetween.

J-K flip-flop A of counter circuit 29 produces a logic level signal upon the $Q_a$ output terminal thereof and a complementary logic level signal upon the $\overline{Q}_a$ output terminal 0 thereof of a frequency one-half the frequency of the output signal of NAND gate 17, as is shown in respective FIGS. 8C and 8D. The signal appearing upon the $Q_a$ output terminal of J-K flip-flop A is applied to the C or clock input terminal of J-K flip-flop B which, in response to this signal, produces a logic level signal upon the $Q_b$ output terminal and a complementary logic level signal upon the $\overline{Q}_b$ output terminal of a frequency one-half the frequency of the logic level signal appearing upon the $Q_a$ output terminal of J-K flip-flop A, as is shown in respective FIGS. 8E and 8F. The signal appearing upon the $Q_b$ output terminal of J-K flip-flop B is applied to the C or clock input terminal of J-K flip-flop C which, in response to this signal, produces a logic level signal upon the $Q_c$ output terminal thereof and a complementary logic level signal upon the $\overline{Q}_c$ output terminal thereof of a frequency one-half the frequency of the logic level signal appearing upon the $Q_b$ output terminal of J-K flip-flop B, as is set forth in respective FIGS. 8G and 8H. That is, counter circuit 29 is responsive to the output signals of variable frequency oscillator 19 for producing a plurality of series of logic level signals and a plurality of series of complementary logic level signals, the repetition rate f each series of logic level signals and each series of complementary logic level signals being one-half the repetition rate of the series of logic level signals and the series of complementary logic level signals of the next highest repetition rate.

The logic level signals of the lowest repetition rate, which appear upon the $Q_c$ output terminal of J-K flip-flop C as illustrated in FIG. 8G, are applied to the C or clock input terminals of all of the J-K flip-flop circuits D, E and F of shift register circuit 39. The J-K flip-flop circuits of shift register circuit 39 are responsive to the series of logic level signals of the lowest repetition rate which appear upon the $Q_c$ output terminal of J-K flip-flop C to produce a repeating series of six electrical timing signals in a manner well known in the art. The electrical timing signal appearing upon the $Q_d$ output terminal of J-K flip-flop D is illustrated in FIG. 8I, the electrical timing signal appearing upon the $Q_e$ output terminal of J-K flip-flop E is illustrated in FIG. 8J, the electrical timing signal appearing upon the $Q_f$ output terminal of J-K flip-flop F is illustrated in FIG. 8K, the electrical timing signal appearing upon the $\overline{Q}_d$ output terminal of J-K flip-flop D is illustrated in FIG. 8L, the electrical timing signal appearing upon the $\overline{Q}_e$ output terminal of J-K flip-flop E is illustrated in FIG. 8M and the electrical timing signal appearing upon the $\overline{Q}_f$ output terminal of J-K flip-flop F is illustrated in FIG. 8N. It may be noted that each of these electrical timing signals are in the logic 1 state for a period of 180 electrical degrees of motor energization during which a corresponding inverter silicon controlled rectifier is to be conductive. That is, the leading and trailing edges of each of these electrical timing signals marks the beginning and end, respectively, of a conduction period during which the corresponding inverter silicon controlled rectifier is to be conductive.

FIG. 7 sets forth in schematic form a trigger signal amplifier circuit suitable for use with the three-phase inverter control circuit of this invention. The collector electrode 56 and the emitter electrode 57 of type NPN transistor 55 is connected, through a series collector resistor 59, across the positive and negative polarity terminals of a suitable conventional source of direct current operating potential, not shown, in the proper polarity relationship for forward collector-emitter conduction through a type NPN transistor. The base electrode 58 of type NPN transistor 55 is connected to junction 61 between resistors 62 and 63, connected in series across input terminal 64 and point of reference or ground potential 7. Also connected across the source of direct current operating potential, is a capacitor 74 and the series combination of the collector electrodes 66 and 76 and emitter electrodes 67 and 77, in parallel, of respective type NPN transistors 65 and 75 connected in Darlington pair, the parallel combination of capacitor 88 and current limiting resistor 79 and the primary winding 86 of a pulse transformer 85 having a secondary winding 87 magnetically coupled to primary winding 86. The base electrode 68 of transistor 65 of the Darlington pair is connected to the junction 81 between collector resistor 59 and collector electrode 56 of type NPN transistor 55 through the parallel combination of resistor 82 and capacitor 83. Capacitor 74 charges to a magnitude substantially equal to the magnitude of the source of direct current operating potential through diode 84 which is poled to prevent the discharge of capacitor 74 back through the source of direct current operating potential. With a logic 1 potential signal of a positive polarity applied to input terminal 64, the polarity of the potential upon junction 61 is positive with respect to point of reference of ground potential 7 and is applied across the base-emitter electrodes of type NPN transistor 55 in the proper polarity relationship to produce base-emitter drive current and, consequently, collector-emitter conduction through a type NPN transistor. Conducting type NPN transistor 55 drains base drive current from the transistor 65 and 75 Darlington pair, consequently, transistors 65 and 75 are not conductive. With a logic O or ground potential signal applied to input terminal 64, the base-emitter electrodes of type NPN transistor 55 are at substantially the same potential, consequently, type NPN transistor 55 does not conduct through the collector-emitter electrodes. With transistor 55 not conducting through the collector-emitter electrodes, base drive current is supplied to the type NPN transistor 65 and 75 Darlington pair in the proper polarity relationship to produce base-emitter and, consequently, collector-emitter conduction therethrough. Conducting Darlington pair transistors 65 and 75 establish a discharge circuit for capacitor 74 initially through capacitor 88 which substantially short circuits resistor 79 and primary winding 86 of pulse transformer 85. Capacitor 88 provides a fast rise energizing current pulse through primary winding 86 which gradually decays as capacitor 88 charges and, upon the charge of capacitor 88, levels at a magnitude determined by the ohmic value of resistor 79. That is, each time a logic 0 signal is applied to input terminal 64, capacitor 74 discharges through primary winding 86 of pulse transformer 85. The resulting change of primary winding 86 magnetic flux induces a gate power signal in secondary winding 87 which is applied across the gate-cathode electrodes of the corresponding inverter silicon controlled rectifier through respective output terminals G and C.

Assuming that motor 8 of FIG. 6 is running and that inverter silicon controlled rectifiers 2, 4 and 5 are conducting during the sixth conduction period, the motor phase windings are energized from battery 9 by a phase winding energizing current flowing into phase winding 8*c* through conducting inverter silicon controlled rectifier 5 and out of phase windings 8*a* and 8*b* through respective conducting inverter silicon controlled rectifiers 2 and 4.

As variable frequency oscillator 19 continues to produce output signals, a logic 1 electrical timing signal, marking the beginning of the next or first conduction period, appears upon the $Q_d$ output terminal of J-K flip-flop D, FIG. 8I. This logic 1 electrical timing signal is applied to one of the input terminals of forward inverter silicon controlled rectifier NAND gate 11 and to one of the input terminals of forward extinguishing silicon controlled rectifier NAND gate 12E, FIG. 4, through point 30(1) of FIG. 1 and points 30(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through point 10(1) of FIG. 1 and 10(4) of FIG. 4; the logic 1 complementary logic level signal present upon the $\overline{Q}_a$, $\overline{Q}_b$ and $\overline{Q}_c$ output terminal of each of J-K flip-flops A, B and C, FIGS. 8D, 8F, and 8H, are applied to respective input terminals of inhibit NAND gate 27; the logic 1 signal present upon the $\overline{Q}_c$ output terminal of J-K flip-flop C, FIG. 8H, is applied to one of the input terminals of all of the forward extinguishing silicon controlled rectifier NAND gates 11E through 16E, through point 90(1) of FIG. 1 and point 90(4) of FIG. 4 and the logic 1 signal present upon the $\overline{Q}_e$ output terminal of J-K flip-flop E, FIG. 8M, is applied to another input terminal of forward extinguishing silicon controlled rectifier NAND gate 12E through point 60(1) of FIG. 1 and point 60(4) of the lower portion of FIG. 4. With a logic 1 signal present upon each of the input terminals of forward extinguishing silicon controlled rectifier NAND gate 12E from the $Q_d$ output terminal of J-K flip-flop D, the $\overline{Q}_c$ output terminal of J-K flip-flop c and the $\overline{Q}_e$ output terminal of J-K flip-flop E, a logic 0 signal appears upon the output terminal thereof for the duration of the logic 1 signal upon the $\overline{Q}_c$ output terminal of J-K flip-flop C, FIG. 8BB, which is applied to the input terminal of the corresponding trigger signal amplifier circuit 32E, as shown in FIG. 4. As has been previously described in regard to the trigger signal amplifier circuit of FIG. 7, with the presence of a logic 0 signal upon the input terminal of trigger signal amplifier 32E, the transistor Darlington pair corresponding to transistors 65 and 75 of FIG. 7 completes a discharge circuit for the capacitor corresponding to capacitor 74 through the primary winding of the pulse transformer to produce a gate power signal across the output terminals 32EG and 32EC thereof. This gate power signal is applied across the gate-cathode electrodes, respectively, of the corresponding extinguishing silicon controlled rectifier 2E of FIG. 6 to trigger this device conductive through the anode-cathode electrodes. Conducting extinguishing silicon controlled rectifier 2E applies the charge upon capacitor 38 in an inverse polarity relationship across the anode-cathode electrodes of inverter silicon controlled rectifier 2 to extinguish this device. The logic 1 complementary logic level signal present upon the $\overline{Q}_a$, $\overline{Q}_b$ and $\overline{Q}_c$ output terminal of each of J-K flip-flops A, B and C applied to respective input terminals of inhibit NAND gate 27 produce a logic 0 inhibit signal upon the output terminal thereof, FIG. 8P, which is applied to another one of the input terminals of all of the forward inverter silicon controlled rectifier NAND gates 11 through 16, through point 20(1) of FIG. 1 and point 20(4) of FIG. 4 and is maintained for the duration of the complementary logic level signal of the highest repetition rate present upon the $\overline{Q}_a$ terminal of the J-K flip-flop A, FIG. 8D. With a logic 0 inhibit signal present upon one of the input terminals of forward inverter silicon controlled rectifier NAND gate 11, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through point 20(1) of FIG. 1 and point 20(4) of FIG. 4. With logic 1 signals applied to two of the input terminals of forward inverter silicon controlled rectifier NAND gate 11 from inhibit NAND gate 27 and the $Q_d$ output terminal of J-K flip-flop D, with each rise of an output signal of variable frequency oscillator 19 and NAND gate 17, FIGS. 8A and 8B, a logic 0 signal appears upon the output terminal of forward inverter silicon controlled rectifier NAND gate 11 and with each fall of an output signal of variable frequency oscillator 19 and NAND gate 17, a logic 1 signal appears upon the output terminal of forward inverter silicon controlled rectifier NAND gate 11. Consequently, forward inverter silicon controlled rectifier NAND gate 11 produces a series of inverter silicon controlled rectifier trigger signals of a frequency equal to the output frequency of variable frequency oscillator 19 which are interrupted during each inhibit signal, as shown in FIG. 8Q, and are applied to the input terminal of corresponding trigger signal amplifier circuit 31, as shown in FIG. 4. Each time a logic 0 signal is applied to the input terminal of trigger signal amplifier 31, the transistor Darlington pair corresponding to transistors 65 and 75 of FIG. 7, completes a discharge circuit for the capacitor corresponding to capacitor 74 through the primary winding of the pulse transformer and each time a logic 1 signal is applied to the input terminal of trigger signal amplifier 31, the transistor Darlington pair extinguishes and the capacitor charges. Consequently, a series of gate power signals are induced in the secondary winding of the pulse transformer of a frequency equal to the frequency of the trigger signals and are applied across the gate-cathode electrodes of the corresponding inverter silicon controlled rectifier 1 through respective output terminals 31G and 31C to trigger inverter silicon controlled rectifier 1 conductive. It may be noted that the inhibit signal produced at the beginning of the first conduction period prevents the triggering of inverter silicon controlled rectifier 1 to conduction until the adjacent inverter silicon controlled rectifier 2 has been extinguished to prevent a short circuit across battery 9. With inverter silicon controlled rectifiers 1, 5 and 4 conducting, the motor phase windings, FIG. 6, are energized by a motor phase winding energizing current flowing into phase windings 8*a* and 8*c* through respective conducting inverter silicon controlled rectifiers 1 and 5 and out of phase windings 8*b* through conducting inverter silicon controlled rectifier 4.

As each of the forward inverter silicon controlled rectifier NAND gates produces a series of inverter silicon controlled rectifier trigger signals in a similar manner and since each of the forward extinguishing silicon controlled rectifier NAND gates produces an extinguishing silicon controlled rectifier trigger signal in a similar manner, the operation of only forward inverter silicon controlled rectifier NAND gate 11 and forward extinguishing silicon controlled rectifier NAND gate 12E will be described in detail in this specification.

Marking the beginning of the second conduction period, a logic 1 electrical timing signal appears upon the $Q_e$ output terminal of J-K flip-flop E, FIG. 8J. This logic 1 electrical timing signal is applied to one of the input terminals of forward inverter silicon controlled rectifier NAND gate 16 and to one of the input terminals of forward extinguishing silicon controlled rectifier NAND gate 15E, FIG. 4, through point 50(1) of FIG. 1 and points 50(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through circuitry previously described; the logic 1 complementary logic level signal present upon the $\overline{Q}_a$, $\overline{Q}_b$ and $\overline{Q}_c$ output terminal of each of J-K flip-flops A, B and C are applied to respective input terminals of inhibit NAND gate 27; the logic 1 signal present upon the $\overline{Q}_c$ output terminal of J-K flip-flop C is applied to one of the input terminals of all of the forward extinguishing silicon controlled rectifier NAND gates 11E through 16E, through circuitry previously described and the logic 1 signal present upon the $\overline{Q}_f$ output terminal of J-K flip-flop F, FIG. 8N, is applied to another input terminal of forward extinguishing silicon controlled rectifier NAND gate 15E through point 80(1) of FIG. 1 and point 80(4) of the lower portion of FIG. 4. With a logic 1 signal present upon each of the input terminals of forward extinguishing silicon controlled rectifier NAND gate 15E from the $Q_e$ output terminal of J-K flip-flop E, the $\overline{Q}_c$ output terminal of J-K flip-flop C and the $\overline{Q}_f$ output terminal of J-K flip-flop F, a logic 0 signal appears upon the output terminal thereof for the duration of the logic 1 signal upon the $\overline{Q}_c$ output terminal of J-K flip-flop C, FIG. 8W, which is applied to the input terminal of the corresponding trigger signal amplifier circuit 35E, as shown in FIG. 4, which converts this trigger signal into a gate power signal across output terminals 35EG and 35EC. This gate power signal is applied across the gate-cathode electrodes of the corresponding extinguishing silicon controlled rectifier 5E of FIG. 6 to trigger this device conductive. Conducting extinguishing silicon controlled rectifier 5E applies the charge upon capacitor 18 in an inverse polarity relationship across the anode-cathode electrodes of inverter silicon controlled rectifier 5 to extinguish this device. The logic 1 complementary logic level signal present upon the $\overline{Q}_a$, $\overline{Q}_b$ and $\overline{Q}_c$ output terminal of each of JeK flip-flops A, B and C, applied to respective input terminals of inhibit NAND gate 27, produce a logic 0 inhibit signal upon the output terminal thereof, FIG. 8P, which is applied to another one of the input terminals of all of the forward inverter silicon controlled rectifier NAND gates 11 through 16, through circuitry previously described, and is maintained for the duration of the complementary logic level signal of the highest repetition rate present upon the $\overline{Q}_a$ terminal of J-K flip-flop A. With a logic 0 inhibit signal present upon one of the input terminals of forward inverter silicon controlled rectifier NAND gate 16, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through circuitry previously described. With logic 1 signals applied to two of the input terminals of forward inverter silicon controlled rectifier NAND gate 16 from inhibit NAND gate 27 and the $Q_e$ output terminal of J-K flip-flop E, with each rise of an output signal of variable frequency oscillator 19 and NAND gate 17, a logic 0 signal appears upon the output terminal thereof and with each fall of an output signal of variable frequency oscillator 19 and NAND gate 17, a logic 1 signal appears upon the output terminal thereof.

Consequently, forward inverter silicon controlled rectifier NAND gate 16 produces a series of inverter silicon controlled rectifier trigger signals of a frequency equal to the output frequency of variable frequency oscillator 19 which are interrupted during each inhibit signal, FIG. 8R, and are applied to the input terminal of corresponding trigger signal amplifier circuit 36, as shown in FIG. 4, which converts this series of trigger signals into a series of gate power signals across output terminals 36G and 36C. This series of gate power signals is applied across the gate-cathode electrodes of the corresponding inverter silicon controlled rectifier 6 to trigger this device conductive. It may be noted that the inhibit signal produced at the beginning of the second conduction period prevents the triggering of inverter silicon controlled rectifier 6 conductive until the adjacent inverter silicon controlled rectifier 5 has been extinguished to prevent a short circuit across battery 9. With inverter silicon controlled rectifiers 1, 4 and 6 conducting, the motor phase windings, FIG. 6, are energized by a motor phase winding energizing current flowing into phase winding 8*a* through conducting inverter silicon controlled rectifier 1 and out of phase windings 8*b* and 8*c* through respective conducting inverter silicon controlled rectifiers 4 and 6.

Marking the beginning of the third conduction period, a logic 1 electrical timing signal appears upon the $Q_f$ output terminal of J-K flip-flop F, FIG. 8K. This logic 1 electrical timing signal is applied to one of the input terminals of forward inverter silicon controlled rectifier NAND gate 13 and to one of the input terminals of forward extinguishing silicon controlled rectifier NAND gate 14E, FIG. 4, through point 70(1) of FIG. 1 and points 70(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through circuitry previously described; the logic 1 complementary logic level signal present upon the $\overline{Q}_a$, $\overline{Q}_b$ and $\overline{Q}_c$ output terminal of each of J-K flip-flops A, B and C are applied to respective input terminals of inhibit NAND gate 27; the logic 1 signal present upon the $\overline{Q}_c$ output terminal of J-K flip-flop C is applied to one of the input terminals of all of the forward extinguishing silicon controlled rectifier NAND gates 11E through 16E, through circuitry previously described, and the logic 1 signal present upon the $Q_d$ output terminal of J-K flip-flop D, FIG. 8I, is applied to another input terminal of forward extinguishing silicon controlled rectifier NAND gate 14E through point 30(1) of FIG. 1 and point 30(4) of the lower portion of FIG. 4. With a logic 1 signal present upon each of the input terminals of forward extinguishing silicon controlled rectifier NAND gate 14E from the $Q_f$ output terminal of J-K flip-flop F, the $\overline{Q}_c$ output terminal of J-K flip-flop C and the $Q_d$ output terminal of J-K flip-flop D, a logic 0 signal appears upon the output terminal thereof for the duration of the logic 1 signal upon the $\overline{Q}_c$ output terminal J-K flip-flop C, FIG. 8X, which is applied to the input terminal of the corresponding trigger signal amplifier circuit 34E, as shown in FIG. 4, which converts this trigger signal into a gate power signal across output terminals 34EG and 35EC. This gate power signal is applied across the gate-cathode electrodes of the corresponding extinguishing silicon controlled rectifier 4E of FIG. 6 to trigger this device conductive. Conducting extinguishing silicon controlled rectifier 4E applies the charge upon capacitor 28 in an inverse polarity relationship across the anode-cathode electrodes of inverter silicon controlled rectifier 4 to extinguish this device. The logic 1 complementary logic level signal present upon the $\overline{Q}_a$, $\overline{Q}_b$ and $\overline{Q}_c$ output terminal of each of J-K flip-flops A, B and C, applied to respective input terminals of inhibit NAND gate 27, produce a logic 0 inhibit signal upon the output terminal thereof, FIG. 8P, which is applied to another one of the input terminals of all of the forward inverter silicon controlled rectifier NAND gates 11 through 16, through circuitry previously described, and is maintained for the duration of the complementary logic level signal of the highest repetition rate present upon the $\overline{Q}_a$ terminal of J-K flip-flop A. With a logic 0 inhibit signal present upon one of the input terminals of forward inverter silicon controlled rectifier NAND gate 13, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through circuitry previously described. With logic 1 signals applied to two of the input terminals of forward inverter silicon controlled rectifier NAND gate 13 from inhibit NAND gate 27 and the $Q_f$ output terminal of J-K flip-flop F, with each rise of an output signal of variable frequency oscillator 19 and NAND gate 17, a logic 0 signal appears upon the output terminal thereof and with each fall of an output signal of variable frequency oscillator 19 and NAND gate 17, a logic 1 signal appears upon the output terminal thereof.

Consequently, forward inverter silicon controlled rectifier NAND gate 13 produces a series of inverter silicon controlled rectifier trigger signals of a frequency equal to the output frequency of variable frequency oscillator 19 which are interrupted during each inhibit signal, FIG. 8S, and are applied to the input terminal of corresponding trigger signal amplifier circuit 33, as shown in FIG. 4, which converts this series of trigger signals into a series of gate power signals across output terminals 33G and 33C. This series of gate power signals is applied across the gate-cathode electrodes of the corresponding inverter silicon controlled rectifier 3 to trigger this device conductive. It may be noted that the inhibit signal produced at the beginning of the third conduction period prevents the triggering of inverter silicon controlled rectifier 3 conductive until the adjacent inverter silicon controlled rectifier 4 has been extinguished to prevent a short circuit across battery 9. With inverter silicon controlled rectifiers 1, 3 and 6 conducting, the motor phase windings, FIG. 6, are energized by a motor phase winding energizing current flowing into phase windings **8*a* and 8*b* through respective conducting inverter silicon controlled rectifiers 1 and 3 and out of phase winding 8*c* through conducting inverter silicon controlled rectifier 6**.

Marking the beginning of the fourth conduction period, a logic 1 electrical timing signal appears upon the $\overline{Q}_d$ output terminal of J-K flip-flop D, FIG. 8L. This logic 1 electrical timing signal is applied to one of the input terminals of forward inverter silicon controlled rectifier NAND gate 12 and to one of the input terminals of forward extinguishing silicon controlled rectifier NAND gate 11E, FIG. 4, through point 40(1) of FIG. 1 and points 40(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through circuitry previously described; the logic 1 complementary logic level signal present upon the $\overline{Q}_a$, $\overline{Q}_b$ and $\overline{Q}_c$ output terminal of each of J-K flip-flops A, B and C are applied to respective input terminals of inhibit NAND gate 27; the logic 1 signal present upon the $\overline{Q}_c$ output terminal of J-K flip-flop C is applied to one of the input terminals of all of the forward extinguishing silicon controlled rectifier NAND gates 11E through 16E, through circuitry previously described, and the logic 1 signal present upon the $Q_e$ output terminal of J-K flip-flop E, FIG. 8J, is applied to another input terminal of forward extinguishing silicon controlled rectifier NAND gate 11E through point 50(1) of FIG. 1 and point 50(4) of the lower portion of FIG. 4. With a logic 1 signal present upon each of the input terminals of forward extinguishing silicon controlled rectifier NAND gate 11E from the $\overline{Q}_d$ output terminal of J-K flip-flop D, the $\overline{Q}_c$ output terminal of J-K flip-flop C and the $\overline{Q}_e$ output terminal of J-K flip-flop E, a logic 0 signal appears upon the output terminal thereof for the duration of the logic 1 signal upon the $\overline{Q}_c$ output terminal J-K flip-flop C, FIG. 8Y, which is applied to the input terminal of the corresponding trigger signal amplifier circuit 31E, as shown in FIG. 4, which converts this trigger signal into a gate power signal across output terminals 31EG and 31EC. This gate power signal is applied across the gate-cathode electrodes of the corresponding extinguishing silicon controlled rectifier 1E of FIG. 6 to trigger this device conductive. Conducting extinguishing silicon controlled rectifier 1E applied to the charge upon capacitor 38 in an inverse polarity relationship across the anode-cathode electrodes of inverter silicon controlled rectifier 1 to extinguish this device. The logic 1 complementary logic level signal present upon the $\overline{Q}_a$, $\overline{Q}_b$ and $\overline{Q}_c$ output terminal of each of J-K flip-flops A, B and C, applied to respective input terminals of inhibit NAND gate 27, produce a logic 0 inhibit signal upon the output terminal thereof, FIG. 8P, which is applied to another one of the input terminals of all of the forward inverter silicon controlled rectifier NAND gates 11 through 16, through circuitry previously described, and is maintained for the duration of the complementary logic level signal of the highest repetition rate present upon the $\overline{Q}_a$ terminal of J-K flip-flop A. With a logic 0 inhibit signal present upon one of the input terminals of forward inverter silicon controlled rectifier NAND gate 12, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through circuitry previously described. With logic 1 signals applied to two of the input terminals of forward inverter silicon controlled rectifier NAND gate 12 from inhibit NAND gate 27 and the $\overline{Q}_d$ output terminal of J-K flip-flop D, with each rise of an output signal of variable frequency oscillator 19 and NAND gate 17, a logic 0 signal appears upon the output terminal thereof and with each fall of an output signal of variable frequency oscillator 19 and NAND gate 17, a logic 1 signal appears upon the output terminal thereof.

Consequently, forward inverter silicon controlled rectifier NAND gate 12 produces a series of inverter silicon controlled rectifier trigger signals of a frequency equal to the output frequency of variable frequency oscillator 19 which are interrupted during each inhibit signal, FIG. 8T, and are applied to the input terminal of corresponding trigger signal amplifier circuit 32, as shown in FIG. 4, which converts this series of trigger signals into a series of gate power signals across output terminals 32G and 32C. This series of gate power signals is applied across the gate-cathode electrodes of the corresponding inverter silicon controlled rectifier 2 to trigger this device conductive. It may be noted that the inhibit signal produced at the beginning of the fourth conduction period prevents the triggering of inverter silicon controlled rectifier 2 conductive until the adjacent inverter silicon controlled rectifier 1 has been extinguished to prevent a short circuit across battery 9.

With inverter silicon controlled rectifiers 2, 3 and 6 conducting, the motor phase windings, FIG. 6, are energized by a motor phase winding energizing current flowing into phase winding 8*b* through conducting inverter silicon controlled rectifier 3 and out of phase windings 8*a* and 8*c* through respective conducting inverter silicon controlled rectifiers 2 and 6.

Marking the beginning of the fifth conduction period, a logic 1 electrical timing signal appears upon the $\overline{Q}_e$ output terminal of J-K flip-flop E, FIG. 8M. This logic 1 electrical timing signal is applied to one of the input terminals of forward inverter silicon controlled rectifier NAND gate 15 and to one of the input terminals of forward extinguishing silicon controlled rectifier NAND gate 16E, FIG. 4, through point 60(1) of FIG. 1 and points 60(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through circuitry previously described; the logic 1 complementary logic level signal present upon the $\overline{Q}_a$, $\overline{Q}_b$ and $\overline{Q}_c$ output terminal of each of J-K flip-flops A, B and C are applied to respective input terminals of inhibit NAND gate 27; the logic 1 signal present upon the $\overline{Q}_c$ output terminal of J-K flip-flop C is applied to one of the input terminals of all of the forward extinguishing silicon controlled rectifier NAND gates 11E through 16E, through circuitry previously described, and the logic 1 signal present upon the $Q_f$ output terminal of J-K flip-flop F, FIG. 8K, is applied to another input terminal of forward extinguishing silicon controlled rectifier NAND gate 16F through point 70(1) of FIG. 1 and point 70(4) of the lower portion of FIG. 4. With a logic 1 signal present upon each of the input terminals of forward extinguishing silicon controlled rectifier NAND gate 16E from the $\overline{Q}_e$ output terminal of J-K flip-flop E, the $\overline{Q}_c$ output terminal of J-K flip-flop C and the $Q_f$ output terminal of J-K flip-flop F, a logic 0 signal appears upon the output terminal thereof for the duration of the logic 1 signal upon the $\overline{Q}_c$ output terminal of J-K flip-flop C, FIG. 8Z, which is applied to the input terminal of the corresponding trigger signal amplifier circuit 36E, as shown in FIG. 4, which converts this trigger signal into a gate power signal across output terminals 36EG and 36EC. This gate power signal is applied across the gate-cathode electrodes of the corresponding extinguishing silicon controlled rectifier 6E of FIG. 6 to trigger this device conductive. Conducting extinguishing silicon controlled rectifier 6E applies the charge upon capacitor 18 in an inverse polarity relationship across the anode-cathode electrodes of inverter silicon controlled rectifier 6 to extinguish this device. The logic 1 complementary logic level signal present upon the $\overline{Q}_a$, $\overline{Q}_b$ and $\overline{Q}_c$ output terminal of each of the J-K flip-flops A, B and C, applied to respective input terminals of inhibit NAND gate 27, produce a logic 0 inhibit signal upon the output terminal thereof, FIG. 8P, which is applied to another one of the input terminals of all of the forward inverter silicon controlled rectifier NAND gates 11 through 16, through circuitry previously described, and is maintained for the duration of the complementary logic level signal of the highest repetition rate present upon the $\overline{Q}_a$ terminal of J-K flip-flop A. With a logic 0 inhibit signal present upon one of the input terminals of forward inverter silicon controlled rectifier NAND gate 15, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through circuitry previously described. With logic 1 signals applied to two of the input terminals of forward inverter silicon controlled rectifier NAND gate 15 from inhibit NAND gate 27 and the $\overline{Q}_e$ output terminal of J-K flip-flop E, with each rise of an output signal of variable frequency oscillator 19 and NAND gate 17, a logic 0 signal appears upon the output terminal thereof and with each fall of an output signal of variable frequency oscillator 19 and NAND gate 17, a logic 1 signal appears upon the output terminal thereof.

Consequently, forward inverter silicon controlled rectifier NAND gate 15 produces a series of inverter silicon controlled rectifier trigger signals of a frequency equal to the output frequency of variable frequency oscillator 19 which are interrupted during each inhibit signal, FIG. 8U, and are applied to the input terminal of corresponding trigger signal amplifier circuit 35, as shown in FIG. 4, which converts this series of trigger signals into a series of gate power signals across output terminals 35G and 35C. This series of gate power signals is applied across the gate-cathode electrodes of the corresponding inverter silicon controlled rectifier 5 to trigger this device conductive. It may be noted that the inhibit signal produced at the beginning of the fifth conduction period prevents the triggering of inverter silicon controlled rectifier 5 conductive until the adjacent inverter silicon controlled rectifier 6 has been extinguished to prevent a short circuit across battery 9. With inverter silicon controlled rectifiers 2, 3 and 5 conducting, the motor phase windings, FIG. 6, are energized by motor phase winding energizing current flowing into phase winding 8b and 8c through respective conducting inverter silicon controlled rectifiers 3 and 5 and out of phase winding 8a through conducting inverter silicon controlled rectifier 2.

Marking the beginning of the sixth conduction period, a logic 1 electrical timing signal appears upon the $\overline{Q}_f$ output terminal of J-K flip-flop F, FIG. 8N. This logic 1 electrical timing signal is applied to one of the input terminals of forward inverter silicon controlled rectifier NAND gate 14 and to one of the input terminals of forward extinguishing silicon controlled rectifier NAND gate 13E, FIG. 4, through point 80(1) of FIG. 1 and points 80(4) of both the upper and lower portions of FIG. 4 and is maintained for 180 electrical degrees; the output signals of variable frequency oscillator 19 and NAND gate 17 are applied to one of the input terminals of all of the forward inverter silicon controlled rectifier NAND gates 11 through 16, through circuitry previously described; the logic 1 complementary logic level signal present upon the $\overline{Q}_a\overline{Q}_b$ and $\overline{Q}_c$ output terminal of each of J-K flip-flops A, B and C are applied to respective input terminals of inhibit NAND gate 27; the logic 1 signal present upon the $\overline{Q}_c$ output terminal of J-K flip-flop C is applied to one of the input terminals of all of the forward extinguishing silicon controlled rectifier NAND gates 11E through 16E, through circuitry previously described, and the logic 1 signal present upon the $\overline{Q}_d$ output terminal of J-K flip-flop D, FIG. 8L, is applied to another input terminal of forward extinguishing silicon controlled rectifier NAND gate 13E through point 40(1) of FIG. 1 and point 40(4) of the lower portion of FIG. 4. With a logic 1 signal present upon each of the input terminals of forward extinguishing silicon controlled rectifier NAND gate 13E from the $\overline{Q}_f$ output terminal of J-K flip-flop F, the $\overline{Q}_c$ output terminal of J-K flip-flop C and the $\overline{Q}_d$ output terminal of J-K flip-flop D, a logic 0 signal appears upon the output terminal thereof for the duration of the logic 1 signal upon the $\overline{Q}_c$ output terminal J-K flip-flop C, FIG. 8AA, which is applied to the input terminal of the corresponding trigger signal amplifier circuit 33E, as shown in FIG. 4, which converts this trigger signal into a gate power signal across output terminals 33EG and 33EC. This gate power signal is applied across the gate-cathode electrodes of the corresponding forward extinguishing silicon controlled rectifier 3E of FIG. 6 to trigger this device conductive. Conducting forward extinguishing silicon controlled rectifier 3E applies the charge upon capacitor 28 in an inverse polarity relationship across the anode-cathode electrodes of inverter silicon controlled rectifier 3 to extinguish this device. The logic 1 complementary logic level signal present upon the $\overline{Q}_a$, $\overline{Q}_b$ and $\overline{Q}_c$ output terminal of each of J-K flip-flops A, B and C, applied to respective input terminals of inhibit NAND gate 27, produce a logic 0 inhibit signal upon the output terminal thereof, FIG. 8P, which is applied to another one of the input terminals of all of the forward inverter silicon controlled rectifier NAND gates 11 through 16, through circuitry previously described, and is maintained for the duration of the complementary logic level signal of the highest repetition rate present upon the $\overline{Q}_a$ terminal of J-K flip-flop A. With a logic 0 inhibit signal present upon one of the input terminals of forward inverter silicon controlled rectifier NAND gate 14, a logic 1 signal appears upon the output terminal thereof. At the conclusion of the complementary logic level signal of the highest repetition rate, a logic 0 signal is applied to one of the input terminals of inhibit NAND gate 27, consequently, a logic 1 signal appears upon the output terminal thereof until the beginning of the next conduction period, FIG. 8P, and is applied to one of the input terminals of all of the forward inverter silicon controlled rectifier NAND gates 11 through 16, through circuitry previously described. With logic 1 signals applied to two of the input terminals of forward inverter silicon controlled rectifier NAND gate 14 from inhibit NAND gate 27 and $\overline{Q}_f$ output terminal of J-K flip-flop F, with each rise of an output signal of variable frequency oscillator 19 and NAND gate 17, a logic 0 signal appears upon the output terminal thereof and with each fall of an output signal of variable frequency oscillator 19 and NAND gate 17, a logic 1 signal appears upon the output terminal thereof.

Consequently, forward inverter silicon controlled rectifier NAND gate 14 produces a series of inverter silicon controlled rectifier trigger signals of a frequency equal to the output frequency of variable frequency oscillator 19 which are interrupted during each inhibit signal, FIG. 8V, and are applied to the input terminal of corresponding trigger signal amplifier circuit 34, as shown in FIG. 4, which converts this series of trigger signals into a series of gate power signals across output terminals 34G and 34C. This series of gate power signals is applied across the gate-cathode electrodes of the corresponding inverter silicon controlled rectifier 4 to trigger this device conductive. It may be noted that the inhibit signal produced at the beginning of the sixth conduction period prevents the triggering of inverter silicon controlled rectifier 4 conductive until the adjacent inverter silicon controlled rectifier 3 has been extinguished to prevent a short circuit across battery 9. With inverter silicon controlled rectifiers 2, 4 and 5 conducting, the motor phase windings, FIG. 6, are energized by a motor phase winding energizing current flowing into phase winding 8*c* through conducting inverter silicon controlled rectifier 5 and out of phase windings 8*a* and 8*b* through respective conducting inverter silicon controlled rectifiers 2 and 4, to complete 360 electrical degrees of motor energization.

In FIG. 1 is shown a four input terminal brake NAND gate 37 having one input terminal connected to the movable contact 51 of dynamic brake switch 54, another input terminal connected to the $\overline{Q}_f$ output terminal of J-K flip-flop F, another input terminal connected to the $Q_e$ output terminal of J-K flip-flop E and the last input terminal connected to the $Q_c$ output terminal of J-K flip-flop C. The output terminal of brake NAND gate 37 is connected to one of the input terminals of NAND gate 17. Upon the operation of dynamic brake switch 54 to the "brake" position in which movable contact 51 is electrically closed to stationary contact 53, a logic 1 signal of a positive polarity is applied to the corresponding input terminal of brake NAND gate 37. Consequently, during the final half of the second conduction period, the logic 1 signal upon the $Q_e$ output terminal of J-K flip-flop E, FIG. 8J, the logic 1 signal upon the $Q_c$ output terminal of J-K flip-flop C, FIG. 8G, and the logic 1 signal upon the $\overline{Q}_f$ output terminal of J-K flip-flop F, FIG. 8N, are also applied to respective other input terminals of brake NAND gate 37. With a logic 1 electrical signal present upon all of the input terminals of brake NAND gate 37, a logic 0 signal appears upon the output terminal thereof which is applied to one of the input terminals of NAND gate 17. With a logic 0 signal present upon one of the input terminals of NAND gate 17, a logic 1 signal is maintained upon the output terminal thereof. With a logic 1 signal maintained upon the output terminal of NAND gate 17, counter circuit 29 no longer produces the logic level and complementary logic level output signals, consequently, shift register circuit 39 produces no more electrical timing signals. In the absence of the electrical timing signals and the logic level and complementary logic level signals, the forward inverter silicon controlled rectifier NAND gates produce no more inverter silicon controlled rectifier trigger signals and the forward extinguishing silicon controlled rectifier NAND gates produce no more extinguishing silicon controlled rectifier trigger signals. That is, brake NAND gate 37 and NAND gate 17 are responsive to the operation of dynamic brake switch 54 to the "- brake" position to inhibit the production of the inverter silicon controlled rectifier trigger signals and the extinguishing silicon controlled rectifier trigger signals. Consequently, the three inverter silicon controlled rectifiers 1, 6 and 4, which are conducting during the second conduction period remain in the conductive state. With these inverter silicon controlled rectifiers in the conductive state, a direct current energizing current is maintained through the same three motor windings which flows into phase winding 8*a* through conducting inverter silicon controlled rectifier 1 and out of phase windings 8*b* and 8*c* through respective conducting inverter silicon controlled rectifiers 4 and 6 to dynamically brake motor 8.

Although the logic 1 signal appearing upon the $Q_c$ output terminal of J-K flip-flop C, upon the $Q_e$ output terminal of J-K flip-flop E and the $\overline{Q}_f$ output terminal of J-K flip-flop F have been indicated to be applied to brake NAND gate 37, it is to be specifically understood that other combinations of the logic level signals of the lowest repetition rate produced by J-K flip-flop C and the electrical timing signals produced by the shift register circuit 39 may be applied to respective input terminals of brake NAND gate 37, it being only necessary that, in addition to the logic level signal present upon the $Q_c$ output terminal of J-K flip-flop C, that the electrical timing signal having the leading edge which marks the beginning of any conduction period and the electrical timing signal having the trailing edge which marks the next end of a conduction period be applied to respective input terminals of brake NAND gate 37. For example, should it be desirable to have motor braking occur during the fourth conduction period, the logic 1 electrical timing signal which appears upon the $\overline{Q}_d$ output terminal of J-K flip-flop D and the logic 1 electrical timing signal which appears upon the $Q_e$ output terminal of J-K flip-flop E would be combined with the logic 1 signal which appears upon output terminal $Q_c$ of J-K flip-flop C and applied to respective input terminals of brake NAND gate 37.

To operate motor 8 in a reverse direction, a reverse inverter silicon controlled rectifier NAND gate, having three input terminals and one output terminal, corresponding to each inverter silicon controlled rectifier for producing a series of inverter silicon controlled rectifier trigger signals and a reverse extinguishing silicon controlled rectifier NAND gate, having three input terminals and one output terminal, corresponding to each extinguishing silicon controlled rectifier for producing extinguishing silicon controlled trigger signals are provided.

Figure 5:
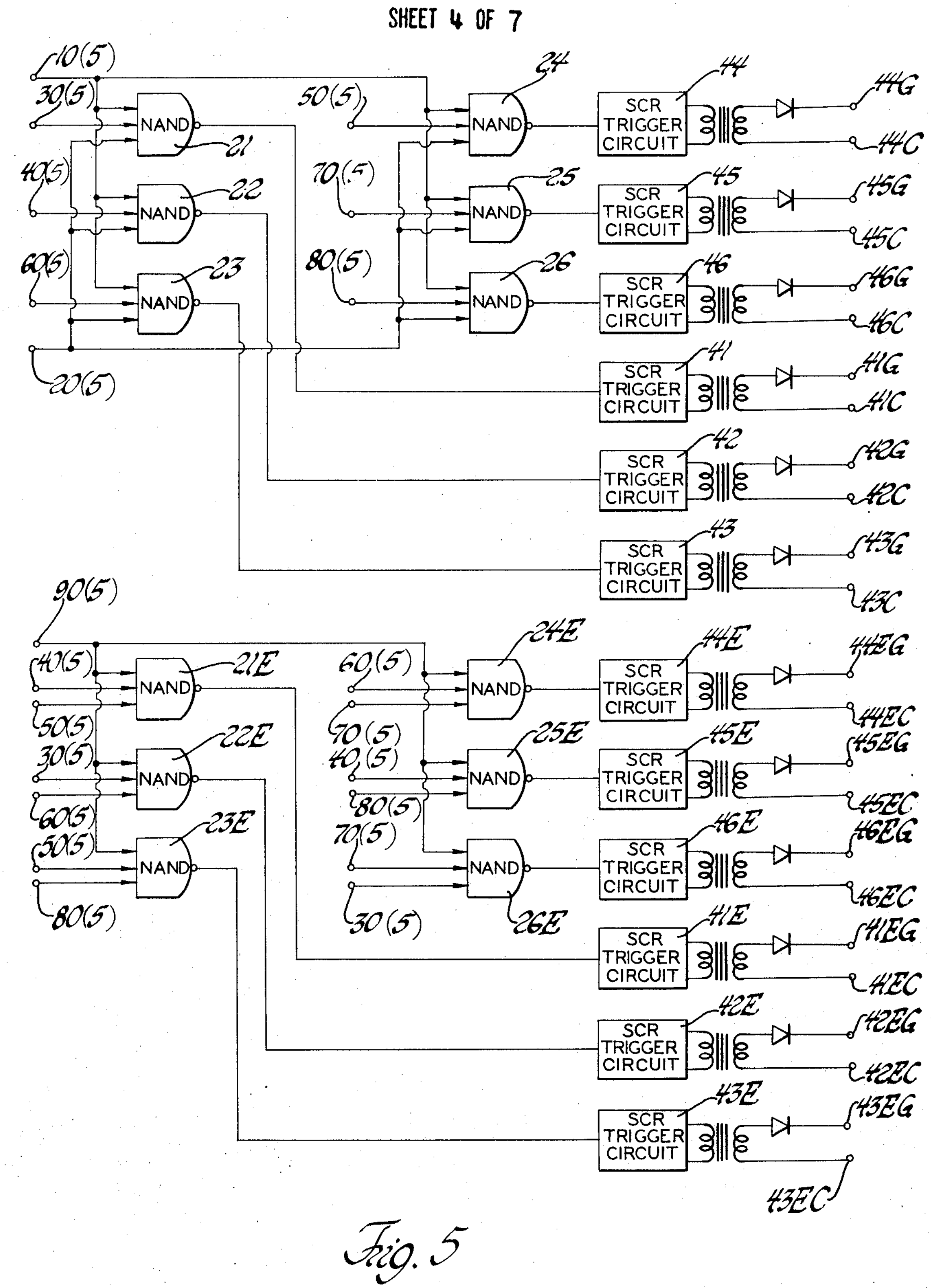
FIG. 5 is a schematic diagram of the inverter and extinguishing silicon controlled rectifier trigger signal logic and gate power amplifiers for motor rotation in a reverse direction.

The reverse inverter silicon controlled rectifier NAND gates which produce the inverter silicon controlled rectifier trigger signals for the operation of motor 8 in a reverse direction and the associated trigger signal amplifier circuits through which the inverter silicon controlled rectifier trigger signals produced by these NAND gates are applied across the gate-cathode electrodes of the inverter silicon controlled rectifiers in the proper sequence to provide for the cyclical energization, in a reverse direction, of the three-phase alternating current motor 8 from direct current supply potential source 9 and the reverse extinguishing silicon controlled rectifier NAND gates which produce the extinguishing silicon controlled rectifier trigger signals and the associated trigger signal amplifier circuits through which the extinguishing silicon controlled rectifier trigger signals produced by these NAND gates are applied across the gate-cathode electrodes of the extinguishing silicon controlled rectifiers in the proper sequence to extinguish the inverter silicon controlled rectifiers in the proper sequence are set forth in schematic form in FIG. 5. The reverse inverter silicon controlled rectifier NAND gates are referenced by the numerals 21, 22, 23, 24, 25 and 26 which correspond to respective inverter silicon controlled rectifiers 1, 2, 3, 4, 5 and 6. The associated trigger signal amplifier circuits, if required, through which the inverter silicon controlled rectifier trigger signals produced by these reverse inverter silicon controlled rectifier NAND gates are applied across the gate-cathode electrodes of the inverter silicon controlled rectifiers are set forth in block form in FIG. 5 and referenced by the numerals 41, 42, 43, 44, 45 and 46. The reverse extinguishing silicon controlled rectifier NAND gates are referenced by the numerals 21E, 22E, 23E, 24E, 25E and 26E which correspond to respective extinguishing silicon controlled rectifiers 1E, 2E, 3E, 4E, 5E and 6E. The associated trigger signal amplifier circuits, if required, through which the extinguishing silicon controlled rectifier trigger signals produced by these reverse extinguishing silicon controlled rectifier NAND gates are applied across the gate-cathode electrodes of the extinguishing silicon controlled rectifiers are referenced by the numerals 41E, 42E, 43E, 44E, 45E and 46E.

Figure 2:
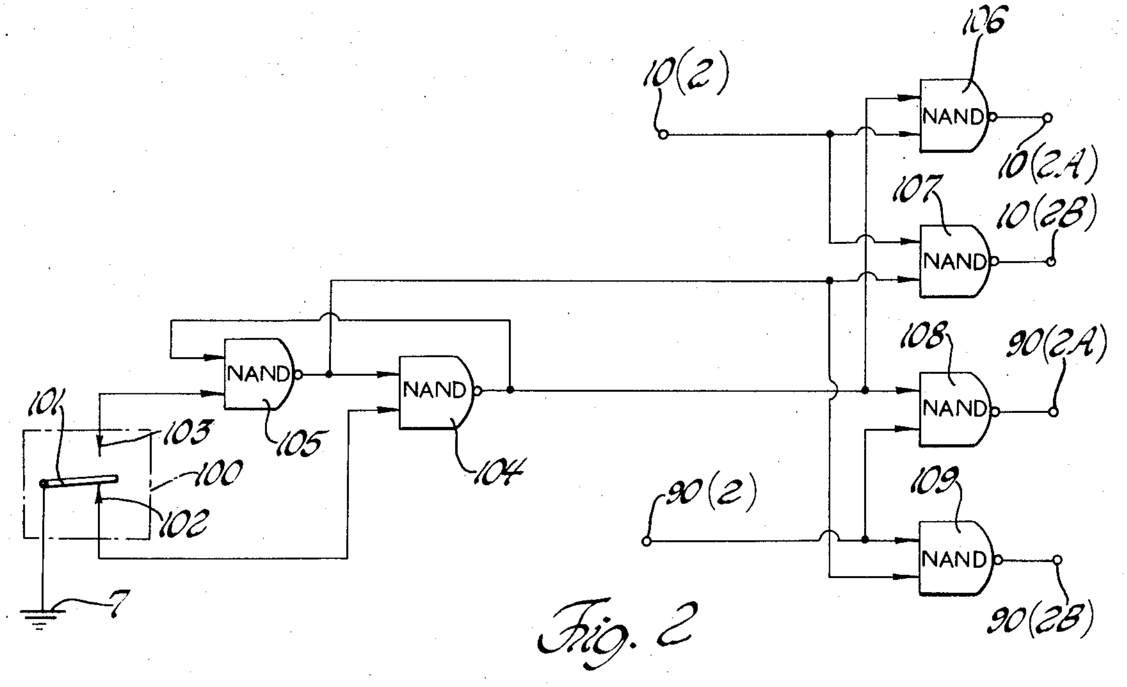

With the motor reversing feature, the circuitry of FIG. 1 is interconnected with the circuitry of FIGS. 4 and 5 by electrical connections between point 10(1) of FIG. 1 and point 10(2) of FIG. 2 and points 10(2A) and 10(2B) of FIG. 2 to respective points 10(4) of FIG. 4 and 10(5) of FIG. 5; between point 20(1) of FIG. 1 and points 20(4) of FIG. 4 and 20(5) of FIG. 5; between point 30(1) of FIG. 1 and all points 30(4) of FIG. 4 and 30(5) of FIG. 5; between point 40(1) of FIG. 1 and all points 40(4) of FIG. 4 and 40(5) of FIG. 5; between point 50(1) of FIG. 1 and all points 50(4) of FIG. 4 and 50(5) of FIG. 5; between point 60(1) of FIG. 1 and all points 60(4) of FIG. 4 and 60(5) of FIG. 5; between point 70(1) of FIG. 1 and all points 70(4) of FIG. 4 and 70(5) of FIG. 5; between point 80(1) of FIG. 1 and all points 80(4) of FIG. 4 and 80(5) of FIG. 5 and between point 90(1) of FIG. 1 and point 90(2) of FIG. 2 and points 90(2A) and 90(2B) of FIG. 2 to respective points 90(4) of FIG. 4 and 90(5) of FIG. 5. These points in FIGS. 1, 4 and 5, although indicated in each as small circles are not necessarily to be interpreted as terminals but are merely convenient points at which the interconnection between the circuitry of FIG. 1 and the circuitry of FIGS. 4 and 5 may be illustrated for purposes of this specification.

An electrical direction of motor rotation selector switch operable to "forward" and "reverse" positions is provided with the motor reversing feature. This switch is illustrated in FIG. 2 as a single pole-double throw electrical switch 100 having a movable contact 101, connected to point of reference or ground potential 7, and two stationary contacts 102 and 103. For purposes of this specification, it will be assumed that, with movable contact 101 of direction of motor rotation selector switch 100 closed to electrical contact with stationary contact 102, as shown in FIG. 2, motor 8 will rotate in a forward direction and that, with movable contact 101 closed to electrical contact with stationary contact 103, motor 8 will rotate in a reverse direction.

Circuitry responsive to the operation of the electrical direction of motor rotation selector switch 100 to the "forward" position and to the "reverse" position for applying the output signals of variable frequency oscillator 19 to one of the input terminals of all of the forward inverter silicon controlled rectifier NAND gates and to one of the input terminals of all of the reserve inverter silicon controlled rectifier NAND gates, respectively, and for applying the series of complementary logic level signals of the lowest repetition rate to one of the input terminals of all of the forward extinguishing silicon controlled rectifier NAND gates and to one of the input terminals of all of the reverse extinguishing silicon controlled rectifier NAND gates, respectively, is provided.

This circuitry is set forth in FIG. 2 and includes NAND gates 104, 105, 106, 107, 108 and 109. With movable contact 101 of electrical direction of motor rotation selector switch 100 operated to the "forward" position in electrical contact with stationary contact 102, a ground or logic 0 signal is applied to one of the input terminals of NAND gate 104 and, since stationary contact 103 is open, an automatic logic 1 signal is applied to one of the input terminals of NAND gate 105. With a logic 0 signal present upon one of the input terminals of NAND gate 104, a logic 1 signal appears upon the output terminal thereof which is applied to the other input terminal of NAND gate 105 and to one of the input terminals of each of NAND gates 106 and 108. With a logic 1 signal present upon both input terminals of NAND gate 105, a logic 0 signal appears upon the output terminal thereof which is applied to one of the input terminals of each of NAND gates 107 and 109. These signals are maintained so long as selector switch 100 is maintained in the "forward" position. With a logic 0 signal maintained upon one input terminal of each of NAND gates 107 and 109, a logic 1 signal is maintained upon the output terminal of each regardless of the logic signal applied to the other input terminal, a condition which disenables these NAND gates while selector switch 100 is in the "forward" position. With a logic 1 signal maintained upon one input terminal of NAND gate 106, with each rise of the output signals of variable frequency oscillator 19, applied to the other input terminal of NAND gate 106 through points 10(1) of FIG. 1 and 10(2) of FIG. 2, a logic 0 signal appears upon the output terminal thereof and with each fall of the output signals of variable frequency oscillator 19, a logic 1 signal appears upon the output terminal thereof. With a logic 1 signal maintained upon one input terminal of NAND gate 108, with each rise of the complementary logic level signals of the lowest repetition rate produced by J-K flip-flop C, applied to the other input terminal of NAND gate 108 through points 90(1) of FIG. 1 and 90(2) of FIG. 2, a logic 0 signal appears upon the output terminal thereof and with each fall of the complementary logic level signals of the lowest repetition rate, a logic 1 signal appears upon the output terminal thereof. Therefore, the signals produced by variable frequency oscillator 19 appear upon the output terminal of NAND gate 106 and the complementary logic level signals of the lowest repetition rate produced by J-K flip-flop C appear upon the output terminal of NAND gate 108. The output signals of variable frequency oscillator 19, therefore, are applied to one of the input terminals of all of the forward inverter silicon controlled rectifier NAND gates through point 10(2A) of FIG. 2 and point 10(4) of FIG. 4 and the complementary logic level signals of the lowest repetition rate produced by J-K flip-flop C are applied to one of the input terminals of all of the forward extinguishing silicon controlled rectifier NAND gates through point 90(2A) of FIG. 2 and point 90(4) of FIG. 4.

With movable contact 101 of electrical direction of motor rotation selector switch 100 operated to the "reverse" position in electrical contact with stationary contact 103, a ground or logic 0 signal is applied to one of the input terminals of NAND gate 105 and, since stationary contact 102 is open, and automatic logic 1 signal is applied to one of the input terminals of NAND gate 104. With a logic 0 signal present upon one of the input terminals of NAND gate 105, a logic 1 signal appears upon the output terminal thereof which is applied to the other terminal of NAND gate 104 and to one of the input terminals of each of NAND gates 107 and 109. With a logic 1 signal present upon both input terminals of NAND gate 104, a logic 0 signal appears upon the output terminal thereof which is applied to the other input terminal of NAND gate 105 and to one of the input terminals of each of NAND gates 106 and 108. These signals are maintained so long as selector switch 100 is maintained in the "reverse" position. With a logic 0 signal maintained upon one input terminal of each of NAND gates 106 and 108, a logic 1 signal is maintained upon the output terminal of each regardless of the logic signal applied to the other input terminal, a condition which disenables these NAND gates while selector switch 100 is in the "reverse" position. With a logic 1 signal maintained upon one input terminal of NAND gate 107, with each rise of the output signals of variable frequency oscillator 19, applied to the other input terminal of NAND gate 107 through points 10(1) of FIG. 1 and 10(2) of FIG. 2, a logic 0 signal appears upon the output terminal thereof and with each fall of the output signals of variable frequency oscillator 19, a logic 1 signal appears upon the output terminal thereof. With a logic 1 signal maintained upon one input terminal of NAND gate 109, with each rise of the complementary logic level signals of the lowest repetition rate produced by J-K flip-flop C, applied to the other input terminal of NAND gate 109 through points 90(1) of FIG. 1 and 90(2) of FIG. 2, a logic 0 signal appears upon the output terminal thereof and with each fall of the complementary logic level signals of the lowest repetition rate, a logic 1 signal appears upon the output terminal thereof. Therefore, the signals produced by variable frequency oscillator 19 appear upon the output terminal of NAND gate 107 and the complementary logic level signals of the lowest repetition rate produced by J-K flip-flop C appear upon the output terminal of NAND gate 109. The output signals of variable frequency oscillator 19, therefore, are applied to one of the input terminals of all of the reverse inverter silicon controlled rectifier NAND gates through point 10(2B) of FIG. 2 and point 10(5) of FIG. 5 and the complementary logic level signals of the lowest repetition rate produced by J-K flip-flop C are applied to one of the input terminals of all of the reverse extinguishing silicon controlled rectifier NAND gates through point 90(2B) of FIG. 2 and point 90(5) of FIG. 5.

The circuitry for applying each electrical timing signal to another input terminal of the forward inverter silicon controlled rectifier which is to be conductive during the conduction period marked by the leading and trailing edges of that electrical timing signal and the circuitry for applying the electrical timing signal having the leading edge which marks the beginning of the next conduction period and the electrical timing signal having the trailing edge which marks the next end of a conduction period to respective input circuits of the one forward extinguishing silicon controlled rectifier NAND gate corresponding to the extinguishing silicon controlled rectifier which, when triggered conductive, will extinguish the inverter silicon controlled rectifier which was conductive during the conduction period last ended while direction of motor rotation selector switch 100 is in the "forward" position is previously described in that position of this specification in which the energization of motor 8 for rotation in a forward direction is explained.

Each electrical timing signal is applied to another input terminal of the reverse inverter silicon controlled rectifier NAND gate which corresponds to the inverter silicon controlled rectifier which is to be conductive during the conduction period marked by the leading and trailing edges of that electrical timing signal while electrical selector switch 100 is in the "reverse" position. That is, the electrical timing signal appearing upon the $Q_d$ output terminal of J-K flip-flop D is applied to another input terminal of reverse inverter silicon controlled rectifier NAND gate 21, corresponding to inverter silicon controlled rectifier 1 which is to be conductive during the conduction period marked by the leading and trailing edges of that electrical timing signal, through point 30(1) of FIG. 1 and point 30(5) of the upper part of FIG. 5; the electrical timing signal appearing upon the $\overline{Q}_d$ output terminal of J-K flip-flop D is applied to another input terminal of reserve inverter silicon controlled rectifier NAND gate 22, corresponding to inverter silicon controlled rectifier 2 which is to be conductive during the conduction period marked by the leading and trailing edges of that electrical timing signal, through point 40(1) of FIG. 1 and point 40(5) of the upper part of FIG. 5; the electrical timing signal appearing upon the $Q_e$ output terminal of J-K flip-flop E is applied to another input terminal of reverse inverter silicon controlled rectifier NAND gate 24, corresponding to inverter silicon controlled rectifier 4 which is to be conductive during the conduction period marked by the leading and trailing edges of that electrical timing signal, through point 50(1) of FIG. 1 and point 50(5) of the upper part of FIG. 5; the electrical timing signal appearing upon the $\overline{Q}_e$ output terminal of J-K flip-flop E is applied to another input terminal of reverse inverter silicon controlled rectifier NAND gate 23, corresponding to inverter silicon controlled rectifier 3 which is to be conductive during the conduction period marked by the leading and trailing edges of that electrical timing signal, through point 60(1) of FIG. 1 and point 60(5) of the upper part of FIG. 5; the electrical timing signal appearing upon the $Q_f$ output terminal of J-K flip-flop F is applied to another input terminal of inverter silicon controlled rectifier NAND gate 25, corresponding to inverter silicon controlled rectifier 5 which is to be conductive during the conduction period marked by the leading and trailing edges of that electrical timing signal, through point 70(1) of FIG. 1 and point 70(5) of the upper part of FIG. 5 and the electrical timing signal appearing upon the $\overline{Q}_f$ output terminal of J-K flip-flop F is applied to another input terminal of reverse inverter silicon controlled rectifier NAND gate 26, corresponding to inverter silicon controlled rectifier 6 which is to be conductive during the conduction period marked by the leading and trailing edges of that electrical timing signal, through point 80(1) of FIG. 1 and point 80(5) of the upper part of FIG. 5. Consequently, each of reverse inverter silicon controlled rectifier NAND gates 21 through 26, inclusive, produces a series of inverter silicon controlled rectifier trigger signals as shown in FIGS. 8CC, 8DD, 8EE, 8FF, 8GG and 8HH in response to the output signals of variable frequency oscillator 19 and the electrical timing signal which makes the conduction period during which the corresponding reverse inverter silicon controlled rectifier is to be conductive.

The series of inverter silicon controlled rectifier trigger signals produced by each reverse inverter silicon controlled rectifier NAND gate are applied across the gate-cathode electrodes of the inverter silicon controlled rectifier to which it corresponds. In the embodiment of the three-phase inverter control circuit of this invention set forth in this specification, the series of inverter silicon controlled rectifier trigger signals produced by each reverse inverter silicon controlled rectifier NAND gate is applied across the gate-cathode electrodes of the inverter silicon controlled rectifier to which it corresponds through a respective silicon controlled rectifier trigger signal amplifier circuit which, in response to the series of inverter silicon controlled rectifier trigger signals produced by each respective inverter silicon controlled rectifier NAND gate, produces a series of inverter silicon controlled rectifier gate power signals. That is, the series of inverter silicon controlled rectifier trigger signals produced by reverse inverter silicon controlled rectifier NAND gate 21 are applied across the gate-cathode electrodes of inverter silicon controlled rectifier 1 through respective output terminals 41G and 41C of silicon controlled rectifier trigger signal amplifier circuit 41, the series of inverter silicon controlled rectifier trigger signals produced by reverse inverter silicon controlled rectifier NAND gate 22 are applied across the gate-cathode electrodes of inverter silicon controlled rectifier 2 through respective output terminals 42G and 42C of silicon controlled rectifier trigger signal amplifier circuit 42, the series of inverter silicon controlled rectifier trigger signals produced by reverse inverter silicon controlled rectifier NAND gate 23 are applied across the gate-cathode electrodes of inverter silicon controlled rectifier 3 through respective output terminals 43G and 43C of silicon controlled rectifier trigger signal amplifier circuit 43, the series of inverter silicon controlled rectifier trigger signals produced by reverse inverter silicon controlled rectifier NAND gate 24 are applied across the gate-cathode electrodes of inverter silicon controlled rectifier 4 through respective output terminals 44G and 44C of silicon controlled rectifier trigger signal amplifier circuit 44, the series of inverter silicon controlled rectifier trigger signals produced by reverse inverter silicon controlled rectifier NAND gate 25 are applied across the gate-cathode electrodes of inverter silicon controlled rectifier 5 through respective output terminals 45G and 45C of silicon controlled rectifier trigger signal amplifier circuit 45 and the series of inverter silicon controlled rectifier NAND gate 26 are applied across the gate-cathode electrodes of inverter silicon controlled rectifier 6 through respective output terminals 46G and 46C of silicon controlled rectifier trigger signal amplifier circuit 46.

The electrical timing signal having the leading edge which marks the beginning of the next conduction period and the electrical timing signal having the trailing edge which marks the next end of a conduction period are applied to respective input circuits of the one reverse extinguishing silicon controlled rectifier NAND gate corresponding to the extinguishing silicon controlled rectifier which, when triggered conductive, will extinguish the inverter silicon controlled rectifier which was conductive during the conduction period last ended. That is, the electrical timing signal appearing upon the $Q_d$ output terminal of J-K flip-flop D, the leading edge of which marks the beginning of the first conduction period, and the electrical timing signal appearing upon the $\overline{Q}_e$ output terminal of J-K flip-flop E, the trailing edge of which marks the next end of a conduction period, are applied, through respective points 30(1) and 60(1) of FIG. 1 and points 30(5) and 60(5) of the lower part of FIG. 5, to respective input terminals of extinguishing silicon controlled rectifier NAND gate 22E, corresponding to extinguishing silicon controlled rectifier 2E which when triggered conductive, will extinguish inverter silicon controlled rectifier 2 which was conductive during the conduction period last ended, marked by the leading and trailing edges of the electrical timing signal present upon the $\overline{Q}_d$ output terminal of J-K flip-flop D; the electrical timing signal appearing upon the $Q_e$ output terminal of J-K flip-flop E, the leading edge of which marks the beginning of the second conduction period, and the electrical timing signal appearing upon the $\overline{Q}_f$ output terminal of J-K flip-flop F, the trailing edge of which marks the next end of a conduction period, are applied, through respective points 50(1) and 80(1) of FIG. 1 and points 50(5) and 80(5) of the lower part of FIG. 5, to respective input terminals of extinguishing silicon controlled rectifier NAND gate 23E, corresponding to extinguishing silicon controlled rectifier 3E which, when triggered conductive, will extinguish inverter silicon controlled rectifier 3 which was conductive during the conduction period last ended, marked by the leading and trailing edges of the electrical timing signal present upon the $\overline{Q}_e$ output terminal of J-K flip-flop E; the electrical timing signal appearing upon the $Q_f$ output terminal of J-K flip-flop F, the leading edge of which marks the beginning of the third conduction period, and the electrical timing signal appearing upon the $Q_d$ output terminal of J-K flip-flop D, the trailing edge of which marks the next end of a conduction period, are applied, through respective points 70(1) and 30(1) of FIG. 1 and points 70(5) and 30(5) of the lower part of FIG. 5, to respective input terminals of extinguishing silicon controlled rectifier NAND gate 26E, corresponding to extinguishing silicon controlled rectifier 6E which, when triggered conductive, will extinguish inverter silicon controlled rectifier 6 which was conductive during the conduction period last ended, marked by the leading and trailing edges of the electrical timing signal present upon the $\overline{Q}_f$ output terminal of J-K flip-flop F; the electrical timing signal appearing upon the $\overline{Q}_d$ output terminal of J-K flip-flop D, the leading edge of which marks the beginning of the fourth conduction period, and the electrical timing signal appearing upon the $Q_e$ output terminal of J-K flip-flop E, the trailing edge of which marks the next end of a conduction period, are applied, through respective points 40(1) and 50(1) of FIG. 1 and points 40(5) and 50(5) of the lower part of FIG. 5, to respective input terminals of extinguishing silicon controlled rectifier NAND gate 21E, corresponding to extinguishing silicon controlled rectifier 1E which, when triggered conductive, will extinguish inverter silicon controlled rectifier 1 which was conductive during the conduction period last ended, marked by the leading and trailing edges of the electrical timing signal present upon the $Q_d$ output terminal of J-K flip-flop D; the electrical timing signal appearing upon the $\overline{Q}_e$ output terminal of J-K flip-flop E, the leading edge of which marks the beginning of the fifth conduction period, and the electrical timing signal appearing upon the $Q_f$ output terminal of J-K flip-flop F, the trailing edge of which marks the next end of a conduction period, are applied, through respective points 60(1) and 70(1) of FIG. 1 and points 60(5) and 70(5) of the lower part of FIG. 5, to respective input terminals of extinguishing silicon controlled rectifier NAND gate 24E, corresponding to extinguishing silicon controlled rectifier 4E which, when triggered conductive, will extinguish inverter silicon controlled rectifier 4 which was conductive during the conduction period last ended, marked by the leading and trailing edges of the electrical timing signal present upon the $Q_e$ output terminal of J-K flip-flop E and the electrical timing signal appearing upon the $\overline{Q}_f$ output terminal of J-K flip-flip F, the leading edge of which marks the beginning of the sixth conduction period, and the electrical timing signal appearing upon the $\overline{Q}_d$ output terminal of J-K flip-flop D, the trailing edge of which marks the next end of a conduction period, are applied, through respective points 80(1) and 40(1) of FIG. 1 and points 80(5) and 40(5) of the lower part of FIG. 5, to respective input terminals of extinguishing silicon controlled rectifier NAND gate 25E, corresponding to extinguishing silicon controlled rectifier 5E which, when triggered conductive, will extinguish the inverter silicon controlled rectifier which was conductive during the conduction period last ended, marked by the leading and trailing edges of the electrical timing signal present upon the $Q_f$ output terminal of J-K flip-flop F. Consequently, each of reverse extinguishing silicon controlled rectifier NAND gates 21E through 26E, inclusive, produce an extinguishing silicon controlled rectifier trigger signal as shown in FIGS. 8II, 8JJ, 8KK, 8LL, 8MM and 8NN in response to the complementary logic level signal of the lowest repetition rate, the electrical timing signal having the leading edge which marks the beginning of the next conduction period and the electrical timing signal having the trailing edge which marks the next end of a conduction period.

The extinguishing silicon controlled rectifier trigger signal produced by each reversing extinguishing silicon controlled rectifier NAND gate is applied across the gate-cathode electrodes of the extinguishing silicon controlled rectifier to which it corresponds. In the embodiment of the three-phase inverter control circuit of this invention set forth in this specification, the extinguishing silicon controlled rectifier trigger signal produced by each reverse extinguishing silicon controlled rectifier NAND gate is applied across the gate-cathode electrodes of the extinguishing silicon controlled rectifier to which it corresponds through a respective silicon controlled rectifier trigger signal amplifier circuit which, in response to the extinguishing silicon controlled rectifier trigger signal produced by each respective reverse extinguishing silicon controlled rectifier NAND gate, produces an extinguishing silicon controlled rectifier gate power signal. That is, the extinguishing inverter silicon controlled rectifier trigger signal produced by reverse extinguishing silicon controlled rectifier NAND gate 21E is applied across the gate-cathode electrodes of extinguishing silicon controlled rectifier 1E through respective output terminals 41EG and 41EC of silicon controlled rectifier trigger signal amplifier circuit 41E, the extinguishing silicon controlled rectifier trigger signal produced by reverse extinguishing silicon controlled rectifier NAND gate 22E is applied across the gate-cathode electrodes of extinguishing silicon controlled rectifier 2E through respective output terminals 42EG and 42EC of silicon controlled rectifier trigger signal amplifier circuit 42E, the extinguishing silicon controlled rectifier trigger signal produced by reverse extinguishing silicon controlled rectifier NAND gate 23E is applied across the gate-cathode electrodes of extinguishing silicon controlled rectifier 3E through respective output terminals 43EG and 43EC of silicon controlled rectifier trigger signal amplifier circuit 43E, the extinguishing silicon controlled rectifier trigger signal produced by reverse extinguishing silicon controlled rectifier NAND gate 24E is applied across the gate-cathode electrodes of extinguishing silicon controlled rectifier 4E through respective output terminals 44EG and 44EC of silicon controlled rectifier trigger signal amplifier circuit 44E, the extinguishing inverter silicon controlled rectifier trigger signal produced by reverse extinguishing silicon controlled rectifier NAND gate 25E is applied across the gate-cathode electrodes of extinguishing silicon controlled rectifier 5E through respective output terminals 45EG and 45EC of silicon controlled rectifier trigger signal amplifier circuit 45E and the extinguishing silicon controlled rectifier trigger signal produced by reverse extinguishing silicon controlled rectifier NAND gate 26E is applied across the gate-cathode electrodes of extinguishing silicon controlled rectifier 6E through respective output terminals 46EG and 46EC of silicon controlled rectifier trigger signal amplifier circuit 46E.

The output signal produced by inhibit NAND gate 27 upon the simultaneous application of the three complementary logic level signals to respective input terminals thereof is applied to another input terminal of all of the reverse inverter silicon controlled rectifier NAND gates through point 20(1) of FIG. 1 and point 20(5) of FIG. 5.

As the reverse inverter silicon controlled rectifier NAND gates and the reverse extinguishing silicon controlled rectifier NAND gates are responsive to the output signals of variable frequency oscillator 19 and one of the electrical timing signals for producing series of inverter silicon controlled rectifier trigger signals and to the complementary logic level signal of the lowest repetition rate and two of the electrical timing signals for producing extinguishing silicon controlled rectifier trigger signals, respectively, in a manner identical to that described earlier in this specification in regard to the forward inverter silicon controlled rectifier NAND gates and the forward extinguishing silicon controlled rectifier NAND gates, the operation thereof will not be described in detail. With the movable contact 101 of direction of motor rotation selector switch 100 in the "reverse" position, the gate power signals are applied to the inverter and extinguishing silicon controlled rectifiers in a sequence which reverses the cyclical energization of two of the phases from that with the selector switch in the "forward" position, a condition which produces rotation of motor 8 in the opposite direction. Without intention or inference of a limitation thereof, the logic arrangement of FIG. 5 reverses the energization of motor phase windings 8b and 8c from that provided by the logic arrangement of FIG. 4. This is best illustrated by curves 8CC, 8DD, 8EE, 8FF, 8GG, 8HH, 8II, 8JJ, 8KK, 8LL, 8MM and 8NN.

Although specific logic devices have been set forth in this specification, it is to be specifically understood that logic devices having similar electrical characteristics may be substituted therefor without departing from the spirit of the invention.

While a preferred embodiment of the present invention has been herein disclosed and described, it will be obvious to those skilled in the art that various modifications and substitutions may be made without departing from the spirit of the invention which is to be limited only within the scope of the following claims.

What is claimed is:

1. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, means responsive to each of said electrical timing signals and the output signals of said variable frequency oscillator for producing a series of inverter silicon controlled rectifier trigger signals for and applying said series of inverter silicon controlled rectifier trigger signals across said gate-cathode electrodes of said inverter silicon controlled rectifiers in the proper sequence to provide for the cyclical energization of said three-phase alternating current motor from said direct current supply potential source, means responsive to two of said electrical timing signals and the complementary logic level signals of said series of complementary logic level signals of the lowest repetition rate for producing extinguishing silicon controlled rectifier trigger signals for and applying said extinguishing silicon controlled rectifier trigger signals across said gate-cathode electrodes of said extinguishing silicon controlled rectifiers in the proper sequence to extinguish said inverter silicon controlled rectifiers in the proper sequence, and means responsive to said complementary logic level signals for producing a blanking signal for inhibiting the production of said series of inverter silicon controlled rectifier trigger signals for the duration of one of the complementary logic level signals of said series of complementary logic level signals of the highest repetition rate.

2. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, means responsive to each of said electrical timing signals and the output signals of said variable frequency oscillator for producing a series of inverter silicon controlled rectifier trigger signals for and applying said series of inverter silicon controlled rectifier trigger signals across said gate-cathode electrodes of said inverter silicon controlled rectifiers in the proper sequence to provide for the cyclical energization of said three-phase alternating current motor from said direct current supply potential source, means responsive to two of said electrical timing signals and the complementary logic level signals of said series of complementary logic level signals of the lowest repetition rate for producing extinguishing silicon controlled rectifier trigger signals for and applying said extinguishing silicon controlled rectifier trigger signals across said gate-cathode electrodes of said extinguishing silicon controlled rectifiers in the proper sequence to extinguish said inverter silicon controlled rectifiers in the proper sequence, means responsive to said complementary logic level signals for producing a blanking signal for inhibiting the production of said series of inverter silicon controlled rectifier trigger signals for the duration of one of the complementary logic level signals of said series of complementary logic level signals of the highest repetition rate, a dynamic brake switch operable to a "brake" position, and circuitry responsive to the operation of said dynamic brake switch to said "brake" position for inhibiting the production of said series of inverter silicon controlled rectifier trigger signals and said extinguishing silicon controlled rectifier trigger signals.

3. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectively variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, means responsive to each of said electrical timing signals and the output signals of said variable frequency oscillator for producing a series of inverter silicon controlled rectifier trigger signals for and applying said series of inverter silicon controlled rectifier trigger signals across said gate-cathode electrodes of the said inverter silicon controlled rectifier next to be triggered conductive to provide for the cyclical energization of said three-phase alternating current motor from said direct current supply potential source, means responsive to two of said electrical timing signals and each complementary logic level signal of the said series of complementary logic level signals of the lowest repetition rate for producing an extinguishing silicon controlled rectifier trigger signal for and applying said extinguishing silicon controlled rectifier trigger signal across said gate-cathode electrodes of the said extinguishing silicon controlled rectifier corresponding to the said inverter silicon controlled rectifier next to be extinguished, and means responsive to said complementary logic level signals for producing a blanking signal for inhibiting the production of said series of inverter silicon controlled rectifier trigger signals for the duration of one of the complementary logic level signals of said series of complementary logic level signals of the highest repetition rate.

4. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectively variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, means responsive to each of said electrical timing signals and the output signals of said variable frequency oscillator for producing a series of inverter silicon controlled rectifier trigger signals for and applying said series of inverter silicon controlled rectifier trigger signals across said gate-cathode electrodes of the said inverter silicon controlled rectifier next to be triggered conductive to provide for the cyclical energization of said three-phase alternating current motor from said direct current supply potential source, means responsive to two of said electrical timing signals and each complementary logic level signal of the said series of complementary logic level signals of the lowest repetition rate for producing an extinguishing silicon controlled rectifier trigger signal for and applying said extinguishing silicon controlled rectifier trigger signal across said gate-cathode electrodes of the said extinguishing silicon controlled rectifier corresponding to the said inverter silicon controlled rectifier next to be extinguished, and means responsive to said complementary logic level signals for producing a blanking signal for inhibiting the production of said series of inverter silicon controlled rectifier trigger signals for the duration of one of the complementary logic level signals of said series of complementary logic level signals of the highest repetition rate, a dynamic brake switch operable to a "brake" position, and circuitry responsive to the operation of said dynamic brake switch to said "brake" position for inhibiting the production of said series of inverter silicon controlled rectifier trigger signals and said extinguishing silicon controlled rectifier trigger signals.

5. A three-phase inverter control circuit comprising in combination with a three-phase alternating current motor, a direct current supply potential source and a three-phase inverter circuit having six inverter silicon controlled rectifiers, each having anode, cathode and gate electrode, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, an inverter silicon controlled rectifier NAND gate having three input terminals and one output terminal corresponding to each said inverter silicon controlled rectifier for producing series of inverter silicon controlled rectifier trigger signals, means for applying said output signals of said variable frequency oscillator to one of said input terminals of all of said inverter silicon controlled rectifier NAND gates, means for applying each said electrical timing signal to another said input terminal of the said inverter silicon controlled rectifier NAND gate which corresponds to the said inverter silicon controlled rectifier which is to be conductive during the conduction period marked by the leading and trailing edges of that electrical timing signal, means for applying said series of inverter silicon controlled rectifier trigger signals produced by each of said inverter silicon controlled rectifier NAND gates across said gate-cathode electrodes of the said inverter silicon controlled rectifier to which it corresponds, extinguishing silicon controlled rectifier NAND gate having three input terminals and one output terminal corresponding to each said extinguishing silicon controlled rectifier for producing extinguishing silicon controlled rectifier trigger signals, means for applying said series of complementary logic level signals of the lowest repetition rate to one of said input terminals of all of said extinguishing silicon controlled rectifier NAND gates, means for applying the said electrical timing signal having the leading edge which marks the beginning of the next conduction period and the said electrical timing signal having the trailing edge which marks the next end of a conduction period to respective said input terminals of the one said extinguishing silicon controlled rectifier NAND gate corresponding to the said extinguishing silicon controlled rectifier which, when trigger conductive, will extinguish the said inverter silicon controlled rectifier which was conductive during the conduction period last ended, means for applying said extinguishing silicon controlled rectifier trigger signals produced by each of said extinguishing silicon controlled rectifier NAND gates across said gate-cathode electrodes of the said extinguishing silicon controlled rectifier to which it corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

6. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, an inverter silicon controlled rectifier NAND gate having three input terminals and one output terminal corresponding to each said inverter silicon controlled rectifier for producing series of inverter silicon controlled rectifier trigger signals, means for applying said output signals of said variable frequency oscillator to one of said input terminals of all of said inverter silicon controlled rectifier NAND gates, means for applying each said electrical timing signal to another said input terminal of the said inverter silicon controlled rectifier NAND gate which corresponds to the said inverter silicon controlled rectifier which is to be conductive during the conduction period marked by the leading and trailing edges of that electrical timing signal, means responsive to said series of inverter silicon controlled rectifier trigger signals produced by each respective said inverter silicon controlled rectifier NAND gate for producing series of inverter silicon controlled rectifier gate power signals and applying said gate power signals across said gate-cathode electrodes of the said inverter silicon controlled rectifier to which said inverter silicon controlled rectifier NAND gate corresponds, an extinguishing silicon controlled rectifier NAND gate having three input terminals and one output terminal corresponding to each said extinguishing silicon controlled rectifier for producing extinguishing silicon controlled rectifier trigger signals, means for applying said series of complementary logic level signals of the lowest repetition rate to one of said input terminals of all of said extinguishing silicon controlled rectifier NAND gates, means for applying the said electrical timing signal having the leading edge which marks the beginning of the next conduction period and the said electrical timing signal having the trailing edge which marks the next end of a conduction period to respective said input terminals of the one said extinguishing silicon controlled rectifier NAND gate corresponding to the said extinguishing silicon controlled rectifier which, when triggered conductive, will extinguish the said inverter silicon controlled rectifier which was conductive during the conduction period last ended, means responsive to said extinguishing silicon controlled rectifier trigger signals produced by each respective said forward extinguishing silicon controlled rectifier NAND gate for producing extinguishing silicon controlled rectifier gate power signals and applying said gate power signals across said gate-cathode electrodes of the said extinguishing silicon controlled rectifier to which said extinguishing silicon controlled rectifier NAND gate corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

7. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, a counter circuit responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals of the next highest repetition rate, a shift register circuit responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, an inverter silicon controlled rectifier NAND gate having three input terminals and one output terminal corresponding to each said inverter silicon controlled rectifier for producing series of inverter silicon controlled rectifier trigger signals, means for applying said output signals of said variable frequency oscillator to one of said input terminals of all of said inverter silicon controlled rectifier NAND gates, means for applying each said electrical timing signal to another said input terminal of the said inverter silicon controlled rectifier NAND gate which corresponds to the said inverter silicon controlled rectifier which is to be conductive during the conduction period marked by the leading and trailing edges of that electrical timing signal, means responsive to said series of inverter silicon controlled rectifier trigger signals produced by each respective said inverter silicon controlled rectifier NAND gate for producing series of inverter silicon controlled rectifier gate power signals and for applying said gate power signals across said gate-cathode electrodes of the said inverter silicon controlled rectifier to which said inverter silicon controlled rectifier NAND gate corresponds, an extinguishing silicon controlled rectifier NAND gate having three input terminals and one output terminal corresponding to each said extinguishing silicon controlled rectifier for producing extinguishing silicon controlled rectifier trigger signals, means for applying said series of complementary logic level signals of the lowest repetition rate to one of said input terminals of all of said extinguishing silicon controlled rectifier NAND gates, means for applying the said electrical timing signal having the leading edge which marks the beginning of the next conduction period and the said electrical timing signal having the trailing edge which marks the next end of a conduction period to respective said input terminals of the said extinguishing silicon controlled rectifier NAND gate corresponding to the said extinguishing silicon controlled rectifier which, when triggered conductive, will extinguish the said inverter silicon controlled rectifier which was conductive during the conduction period last ended, means responsive to said extinguishing silicon controlled rectifier trigger signals produced by each respective said extinguishing silicon controlled rectifier NAND gate for producing extinguishing silicon controlled rectifier gate power signals and for applying said gate power signals across said gate-cathode electrodes of the said extinguishing silicon controlled rectifier to which said extinguishing silicon controlled rectifier NAND gate corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

8. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, a forward and a reverse inverter silicon controlled rectifier NAND gate, each having three input terminals and one output terminal, corresponding to each said inverter silicon controlled rectifier for producing series of inverter silicon controlled rectifier trigger signals, an electrical direction of motor rotation selector switch operable to forward and reverse positions, means responsive to the operation of said electrical selector switch to said forward position and to said reverse position for applying said output signals of said variable frequency oscillator to one of said input terminals of all of said forward inverter silicon controlled rectifier NAND gates and to one of said input terminals of all of said reverse inverter silicon controlled rectifier NAND gates, respectively, means for applying each said electrical timing signal to another said input terminal of the said forward inverter silicon controlled rectifier NAND gate which corresponds to the said inverter silicon controlled rectifier which is to be conductive during the conduction period marked by the leading and trailing edges of that electrical timing signal while said electrical selector switch is in said forward position and to another said input terminal of the said reverse inverter silicon controlled rectifier NAND gate which corresponds to the said inverter silicon controlled rectifier which is to be conductive during the conduction period marked by the leading and trailing edges of that electrical timing signal while said electrical selector switch is in said reverse position, means for applying said series of inverter silicon controlled rectifier trigger signals produced by each of said forward inverter silicon controlled rectifier NAND gates across said gate-cathode electrodes of the said inverter silicon controlled rectifier to which it corresponds, means for applying said series of inverter silicon controlled rectifier trigger signals produced by each of said reverse inverter silicon controlled rectifier NAND gates across said gate-cathode electrodes of the said inverter silicon controlled rectifier to which it corresponds, a forward and a reverse extinguishing silicon controlled rectifier NAND gate, each having three input terminals and one output terminal, corresponding to each said extinguishing silicon controlled rectifier for producing extinguishing silicon controlled rectifier trigger signals, means responsive to the operation of said electrical selector switch to said forward position and to said reverse position for applying said series of complementary logic level signals of the lowest repetition rate to one of said input terminals of all of said forward extinguishing silicon controlled rectifier NAND gates and to one of said input terminals of all of said reverse extinguishing silicon controlled rectifier NAND gates, respectively, means for applying the said electrical timing signal having the leading edge which marks the beginning of the next conduction period and the said electrical timing signal having the trailing edge which marks the next end of a conduction period to respective said input terminals of the one said forward extinguishing silicon controlled rectifier NAND gate and the one said reverse extinguishing silicon controlled rectifier NAND gate corresponding to the said extinguishing silicon controlled rectifier which, when triggered conductive, will extinguish the said inverter silicon controlled rectifier which was conductive during the conduction period last ended, means for applying said extinguishing silicon controlled rectifier trigger signals produced by each of said forward extinguishing silicon controlled rectifier NAND gates across the said gate-cathode electrodes of the said extinguishing silicon controlled rectifier to which it corresponds, means for applying said extinguishing silicon controlled rectifier trigger signals produced by each of said reverse extinguishing silicon controlled rectifier NAND gates across the said gate-cathode electrodes of the said extinguishing silicon controlled rectifier to which it corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

9. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, means responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, means responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, a forward and a reverse inverter silicon controlled rectifier NAND gate, each having three input terminals and one output terminal, corresponding to each said inverter silicon controlled rectifier for producing series of inverter silicon controlled rectifier trigger signals, an electrical direction of motor rotation selector switch operable to forward and reverse positions, means responsive to the operation of said electrical selector switch to said forward position and to said reverse position for applying said output signals of said variable frequency oscillator to one of said input terminals of all of said forward inverter silicon controlled rectifier NAND gates and to one of said input terminals of all of said reverse inverter silicon controlled rectifier NAND gates, respectively, means for applying each said electrical timing signal to another said input terminal of the said forward inverter silicon controlled rectifier NAND gate which corresponds to the said inverter silicon controlled rectifier which is to be conductive during the conduction period marked by the leading and trailing edges of that electrical timing signal while said electrical selector switch is in said forward position and to another said input terminal of the said reverse inverter silicon controlled rectifier NAND gate which corresponds to the said inverter silicon controlled rectifier which is to be conductive during the conduction period marked by the leading and trailing edges of that electrical signal while said electrical selector switch is in said reverse position, means responsive to said series of inverter silicon controlled rectifier trigger signals produced by each respective said forward inverter silicon controlled rectifier NAND gate for producing series of inverter silicon controlled rectifier gate power signals and for applying said gate power signals across said gate-cathode electrodes of the said inverter silicon controlled rectifier to which said forward inverter silicon controlled rectifier NAND gate corresponds, means responsive to said series of inverter silicon controlled rectifier trigger signals produced by each respective said reverse inverter silicon controlled rectifier NAND gate for producing series of inverter silicon controlled rectifier gate power signals and for applying said gate power signals across said gate-cathode electrodes of the said inverter silicon controlled rectifier to which said reverse inverter silicon controlled rectifier NAND gate corresponds, a forward and a reverse extinguishing silicon controlled rectifier NAND gate, each having three input terminals and one output terminal, corresponding to each said extinguishing silicon controlled rectifier for producing extinguishing silicon controlled rectifier trigger signals, means responsive to the operation of said electrical selector switch to said forward position and to said reverse position for applying said series of complementary logic level signals of the lowest repetition rate to one of said input terminals of all of said forward extinguishing silicon controlled rectifier NAND gates and to one of said input terminals of all of said reverse extinguishing silicon controlled rectifier NAND gates, respectively, means for applying the said electrical timing signal having the leading edge which marks the beginning of the next conduction period and the said electrical timing signal having the trailing edge which marks the next end of a conduction period to respective said input terminals of the one said forward extinguishing silicon controlled rectifier NAND gate and the one said reverse extinguishing silicon controlled rectifier NAND gate corresponding to the said extinguishing silicon controlled rectifier which, when triggered conductive, will extinguish the said inverter silicon controlled rectifier which was conductive during the conduction period last ended, means responsive to said extinguishing silicon controlled rectifier trigger signals produced by each respective said forward extinguishing silicon controlled rectifier NAND gate for producing extinguishing silicon controlled rectifier gate power signals and for applying said gate power signals across the said gate-cathode electrodes of the said extinguishing silicon controlled rectifier to which said forward extinguishing silicon controlled rectifier NAND gate corresponds, means responsive to said extinguishing silicon controlled rectifier trigger signals produced by each respective said reverse extinguishing silicon controlled rectifier NAND gate for producing extinguishing silicon controlled rectifier gate power signals and for applying said gate power signals across the said gate-cathode electrodes of the said extinguishing silicon controlled rectifier to which said reverse extinguishing silicon controlled rectifier NAND gate corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

10. A three-phase inverter control circuit comprising in combination with a three-phase alternating current motor, a direct current supply potential source and a three-phase inverter circuit having six inverter silicon controlled rectifiers, each having anode, cathode and gate electrodes, through which the phase windings of the motor are cyclically energized from the direct current supply potential source and six extinguishing silicon controlled rectifiers, each corresponding to a respective inverter silicon controlled rectifier and having anode, cathode and gate electrodes, a variable frequency oscillator for producing a series of output signals of a selectable variable frequency, a counter circuit responsive to said output signals of said variable frequency oscillator for producing a plurality of series of logic level signals and a plurality of series of complementary logic level signals, the repetition rate of each series of logic level signals and each series of complementary logic level signals being one-half the repetition rate of the series of logic level signals and the series of complementary logic level signals of the next highest repetition rate, a shift register circuit responsive to said series of logic level signals of the lowest repetition rate for producing a repeating series of six electrical timing signals, the leading and trailing edges of each of which marks the beginning and end, respectively, of a conduction period during which a said inverter silicon controlled rectifier is to be conductive, a forward and a reverse inverter silicon controlled rectifier NAND gate, each having three input terminals and one output terminal, corresponding to each said inverter silicon controlled rectifier for producing series of inverter silicon controlled rectifier trigger signals, an electrical direction of motor rotation selector switch operable to forward and reverse positions, means responsive to the operation of said electrical selector switch to said forward position and to said reverse position for applying said output signals of said variable frequency oscillator to one of said input terminals of all of said forward inverter silicon controlled rectifier NAND gates and to one of said input terminals of all of said reverse inverter silicon controlled rectifier NAND gates, respectively, means for applying each said electrical timing signal to another said input terminal of the said forward inverter silicon controlled rectifier NAND gate which corresponds to the said inverter silicon controlled rectifier which is to be conductive during the conduction period marked by the leading and trailing edges of that electrical timing signal while said electrical selector switch is in said forward position and to another said input terminal of the said reverse inverter silicon controlled rectifier NAND gate which corresponds to the said inverter silicon controlled rectifier which is to be conductive during the conduction period marked by the leading and trailing edges of that electrical signal while said electrical selector switch is in said reverse position, means responsive to said series of inverter silicon controlled rectifier trigger signals produced by each respective said forward inverter silicon controlled rectifier NAND gates for producing series of inverter silicon controlled rectifier gate power signals and for applying said gate power signals across said gate-cathode electrodes of the said inverter silicon controlled rectifier to which said forward inverter silicon controlled rectifier NAND gate corresponds, means responsive to said series of inverter silicon controlled rectifier trigger signals produced by each respective said reverse inverter silicon controlled rectifier NAND gate for producing series of inverter silicon controlled rectifier gate power signals and for applying said gate power signals across said gate-cathode electrodes of the said inverter silicon controlled rectifier to which said reverse inverter silicon controlled rectifier NAND gate corresponds, a forward and a reverse extinguishing silicon controlled rectifier NAND gate, each having three input terminals and one output terminal, corresponding to each said extinguishing silicon controlled rectifier for producing extinguishing silicon controlled rectifier trigger signals, means responsive to the operation of said electrical selector switch to said forward position and to said reverse position for applying said series of complementary logic level signals of the lowest repetition rate to one of said input terminals of all of said forward extinguishing silicon controlled rectifier NAND gates and to one of said input terminals of all of said reverse extinguishing silicon controlled rectifier NAND gates, respectively, means for applying the said electrical timing signal having the leading edge which marks the beginning of the next conduction period and the said electrical timing signal having the trailing edge which marks the next end of a conduction period to respective said input terminals of the one said forward extinguishing silicon controlled rectifier NAND gate and the one said reverse extinguishing silicon controlled rectifier NAND gate corresponding to the said extinguishing silicon controlled rectifier which, when triggered conductive, will extinguish the said inverter silicon controlled rectifier which was conductive during the conduction period last ended, means responsive to said extinguishing silicon controlled rectifier trigger signals produced by each respective said forward extinguishing silicon controlled rectifier NAND gate for producing extinguishing silicon controlled rectifier gate power signals and for applying said gate power signals across the said gate-cathode electrodes of the said extinguishing silicon controlled rectifier to which said forward extinguishing silicon controlled rectifier NAND gate corresponds, means responsive to said extinguishing silicon controlled rectifier trigger signals produced by each respective said reverse extinguishing silicon controlled rectifier NAND gate for producing extinguishing silicon controlled rectifier gate power signals and for applying said gate power signals across the said gate-cathode electrodes of the said extinguishing silicon controlled rectifier to which said reverse extinguishing silicon controlled rectifier NAND gate corresponds, an inverter silicon controlled rectifier trigger signal inhibit NAND gate having an input terminal corresponding to each said series of complementary logic level signals for producing an inverter silicon controlled rectifier trigger signal inhibit signal, means for applying each said series of complementary logic level signals to a respective said input terminal of said inhibit NAND gate, and means for applying said inhibit signal produced by said inhibit NAND gate to another said input terminal of all of said inverter silicon controlled rectifier NAND gates.

* * * * *

PO-1050
(5/69)

UNITED STATES PATENT OFFICE
CERTIFICATE OF CORRECTION

Patent No. 3,697,843 Dated October 10, 1972

Inventor(s) Joseph A. Riess

It is certified that error appears in the above-identified patent and that said Letters Patent are hereby corrected as shown below:

In the Abstract, line 16, after "rectifier" insert -- is --. Column 1, line 16, " 'f " should read -- of --; line 32, "if" should read -- is --; Col. 2, line 59, "in" should read -- of --. Col. 7, line 33, "reference" should read -- referenced --. Col. 14, line 22, " f " should read -- of --. Col. 15, line 27, "of" should read -- or --. Col. 22, line 11, "applied" should read -- applies --; same line, delete "to". Col. 23, line 34, "16F" should read -- 16E --. Col. 29, line 13, "reserve" should read -- reverse--. Col. 31, line 11, after "rectifier" insert -- NAND gate which corresponds to the inverter silicon controlled rectifier --; line 26, "position" should read -- portion --; line 46, "reserve" should read -- reverse --. Col. 33, line 13, after "rectifier" insert -- trigger signals produced by reverse inverter silicon controlled rectifier --. Col. 36, line 31, "thereof" should read -- thereto --.

Signed and sealed this 8th day of May 1973.

(SEAL)
Attest:

EDWARD M.FLETCHER,JR.
Attesting Officer

ROBERT GOTTSCHALK
Commissioner of Patents